(12) United States Patent
Yun et al.

(10) Patent No.: US 11,894,431 B2
(45) Date of Patent: Feb. 6, 2024

(54) MEMORY DEVICE WITH FIXED NEGATIVE CHARGE PLUG

(71) Applicant: SK hynix Inc., Icheon-si (KR)

(72) Inventors: Dae Hwan Yun, Icheon-si (KR); Gil Bok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 356 days.

(21) Appl. No.: 17/231,515

(22) Filed: Apr. 15, 2021

(65) Prior Publication Data
US 2022/0123113 A1 Apr. 21, 2022

(30) Foreign Application Priority Data
Oct. 16, 2020 (KR) .................... 10-2020-0134633

(51) Int. Cl.
*H01L 29/40* (2006.01)
*H10B 43/27* (2023.01)

(52) U.S. Cl.
CPC ........... *H01L 29/408* (2013.01); *H10B 43/27* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50; H01L 29/408
See application file for complete search history.

(56) References Cited

U.S. PATENT DOCUMENTS

| 9,929,171 B2 * | 3/2018 | Aoyama | ................. H10B 43/27 |
| 2010/0309729 A1 * | 12/2010 | Chang | ..................... H10B 43/10 365/185.28 |
| 2011/0101443 A1 * | 5/2011 | Huo | ................... H01L 29/66825 257/324 |
| 2013/0228849 A1 * | 9/2013 | Kim | ...................... H01L 29/792 257/324 |

(Continued)

FOREIGN PATENT DOCUMENTS

KR  1020180021948 A  3/2018

OTHER PUBLICATIONS

Katsuyuki Matsunaga et al., First-principles calculations of intrinsic defects in Al2O3, Physical Review B 68, 085110, The American Physical Society, 2003.

(Continued)

*Primary Examiner* — Didarul A Mazumder
*Assistant Examiner* — Gustavo G Ramallo
(74) *Attorney, Agent, or Firm* — William Park & Associates Ltd.

(57) ABSTRACT

The present technology includes a memory device. The memory device includes a stack structure including word lines and a select line, a vertical hole vertically penetrating the stack structure, and a memory layer, a channel layer, and a plug, sequentially formed along an inner side surface of the vertical hole. The plug includes a material layer having a fixed negative charge.

16 Claims, 23 Drawing Sheets

(56) References Cited

U.S. PATENT DOCUMENTS

| | | | |
|---|---|---|---|
| 2016/0148947 A1* | 5/2016 | Seo | H10B 43/10 |
| | | | 257/324 |
| 2016/0268295 A1* | 9/2016 | Kamigaichi | H10B 43/27 |
| 2018/0053775 A1* | 2/2018 | Nam | H10B 43/27 |
| 2019/0259775 A1* | 8/2019 | Nakatsuka | H01L 29/408 |
| 2020/0083248 A1 | 3/2020 | Uchida | |

OTHER PUBLICATIONS

Thomas Schneider et al., Enhanced density of negative fixed charges in Al2O3 layers on Si through a subsequent deposition of TiO2, Proc. of SPIE vol. 9898, SPIE Photonics Europe, 2016, Brussels, Belgium.

* cited by examiner

MEMORY DEVICE WITH FIXED NEGATIVE CHARGE PLUG

CROSS-REFERENCE TO RELATED APPLICATION

The present application claims priority under 35 U.S.C. § 119(a) to Korean patent application number 10-2020-0134633 filed on Oct. 16, 2020, in the Korean Intellectual Property Office, the entire disclosure of which is incorporated by reference herein.

BACKGROUND

1. Technical Field

The present disclosure generally relates to a memory device, and more particularly, to a three-dimensional memory device.

2. Related Art

A memory device may store data or output stored data. For example, the memory device may be configured as a volatile memory device in which stored data is lost when the supply of power is interrupted, or may be configured as a nonvolatile memory device in which stored data is retained even when the supply of power is interrupted. The memory device may include a memory cell array in which data is stored, peripheral circuits capable of performing a program, read or erase operation, and a logic circuit capable of controlling the peripheral circuits.

The memory cell array may include a plurality of memory blocks, each of the plurality of memory blocks may include a plurality of memory cells. Memory cells may be connected in series to each other between a bit line and a source line, to constitute a string. Memory cells which are included in different strings and are connected to the same word line may constitute a page. A program operation and a read operation may be performed in units of pages, and an erase operation may be performed in units of blocks.

SUMMARY

In accordance with an aspect of the present disclosure, there may be provided a memory device including: a stack structure including word lines and a select line; a vertical hole vertically penetrating the stack structure; and a memory layer, a channel layer, and a plug, sequentially formed along an inner side surface of the vertical hole, wherein the plug includes a material layer having a fixed negative charge.

In accordance with another aspect of the present disclosure, there may be provided a memory device including: a stack structure including word lines and a plurality of select lines; a vertical hole vertically penetrating the stack structure; and a memory layer, channel layer, and a plug, sequentially formed along an inner side surface of the vertical hole, wherein the plug includes a material layer having a fixed negative charge.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure.

Embodiments may provide a memory device capable of improving an erase operation.

Figure 1:
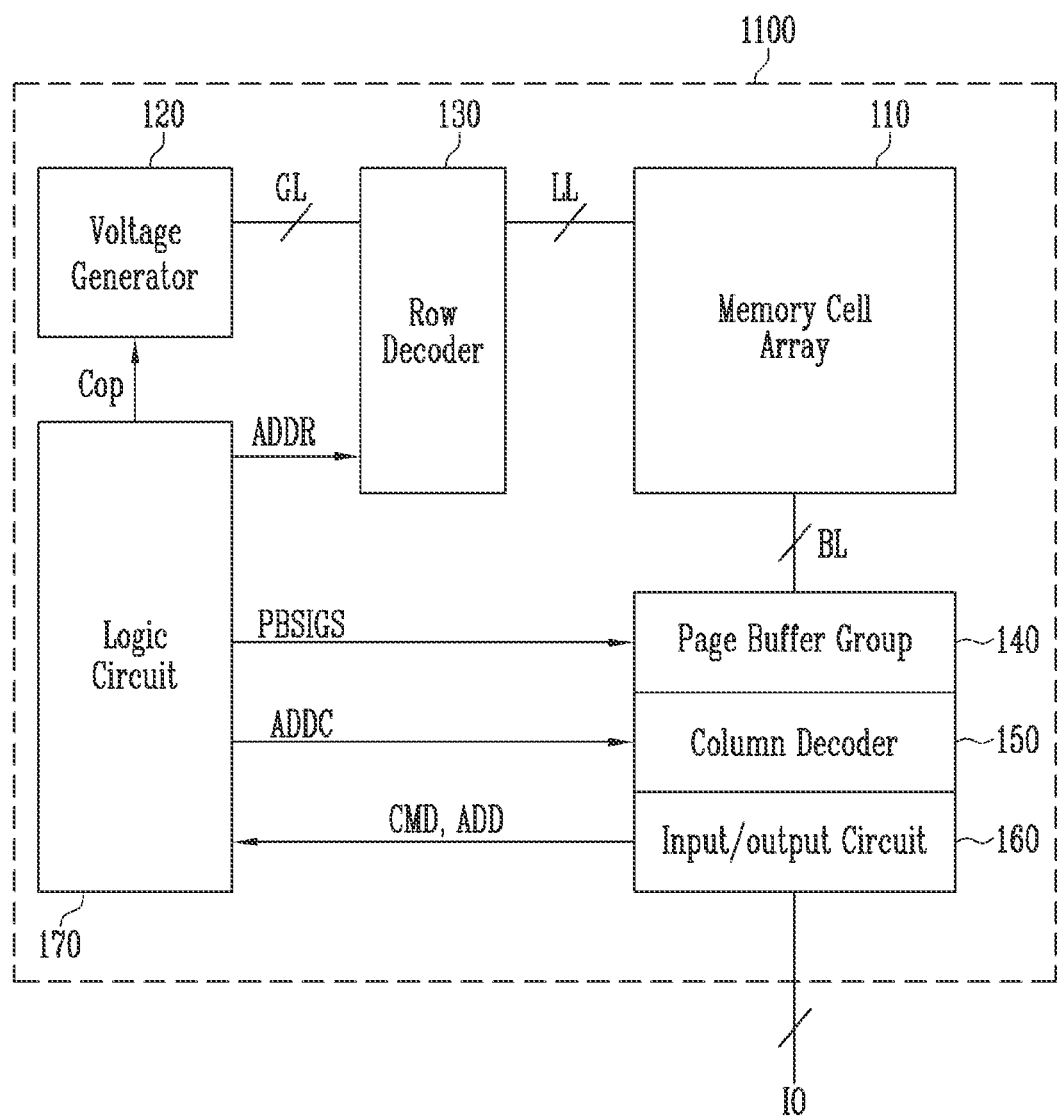
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 1100 may include a memory cell array 110 in which data is stored, peripheral circuits 120, 130, 140, 150, and 160 which perform program, read, and erase operations, and a logic circuit 170 which controls the peripheral circuits 120, 130, 140, 150, and 160. The peripheral circuits 120 to 160 may include a voltage generator 120, a row decoder 130, a page buffer group 140, a column decoder 150, and an input/output circuit 160.

The memory cell array 110 may include a plurality of memory blocks, and each of the memory blocks may include a plurality of memory cells. The memory blocks may be connected to the row decoder 130 through a plurality of local lines LL, and be connected to the page buffer group 140 through a plurality of bit lines BL.

The voltage generator 120 may generate operating voltages necessary for a program, read or erase operation in response to an operation code Cop. For example, the voltage generator 120 may generate operating voltages such as a program voltage, a read voltage, an erase voltage, a pass voltage, a turn-off voltage, and a verify voltage. The operating voltages generated by the voltage generator 120 may be transferred to the row decoder 130 through global lines GL.

The row decoder 130 may select a memory block included in the memory cell array 110 in response to a row address ADDR, and transfer the operating voltages received through the global lines GL to the selected memory block through the local lines LL. The local lines LL may include a plurality of word lines, drain select lines, source select line, and a source line.

The page buffer group 140 may temporarily store data received from the outside in a program operation, and temporarily store data sensed from memory cells in a verify or read operation. The page buffer group 140 may temporarily store data or precharge the bit lines BL in response to page buffer signals PBSIGS, and sense a voltage or current of the bit lines BL. For example, the page buffer group 140 may sense a current or voltage of strings through the bit lines BL in an erase verify operation.

The column decoder 150 may transmit data between the input/output circuit 160 and the page buffer group 140 in response to a column address ADDC.

The input/output circuit 160 may receive a command CMD and an address ADD from an external device (e.g., a controller) through input/output lines IO, and input or output data. In a program operation, the input/output circuit 160 may transfer, to the logic circuit 170, the command CMD and the address ADD, which are input through the input/output lines IO, and transfer data to the page buffer group 140. In a read operation, the input/output circuit 160 may output data read from the page buffer group 140 to the external device.

The logic circuit 170 may be configured with software and hardware, which can control the peripheral circuits in response to the command CMD and the address ADD. The logic circuit 170 may output the operation code Cop, the page buffer signals PBSIGS, the row address ADDR, and the column address ADDC in response to the command CMD and the address ADD.

Figure 2:
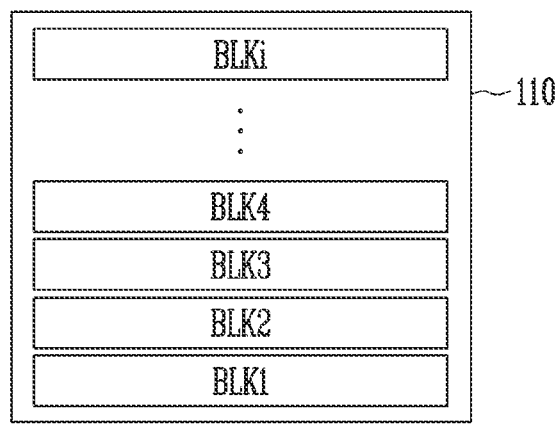
FIG. 2 is a diagram illustrating a memory cell array shown in FIG. 1.

FIG. 2 is a diagram illustrating the memory cell array shown in FIG. 1.

Referring to FIG. 2, the memory cell array 110 may include first to ith memory blocks BLK1 to BLKi. In a single plane structure, the first to ith memory blocks BLK1 to BLKi may constitute the memory cell array 110. In a multi-plane structure, the first to ith memory blocks BLK1 to BLKi may constitute one plane, and a plurality of planes may be included in the memory cell array 110. The first to ith memory blocks BLK1 to BLKi may configured identically to one another, and the ith memory block BLKi among the first to ith memory blocks BLK1 to BLKi will be described in detail as follows.

Figure 3:
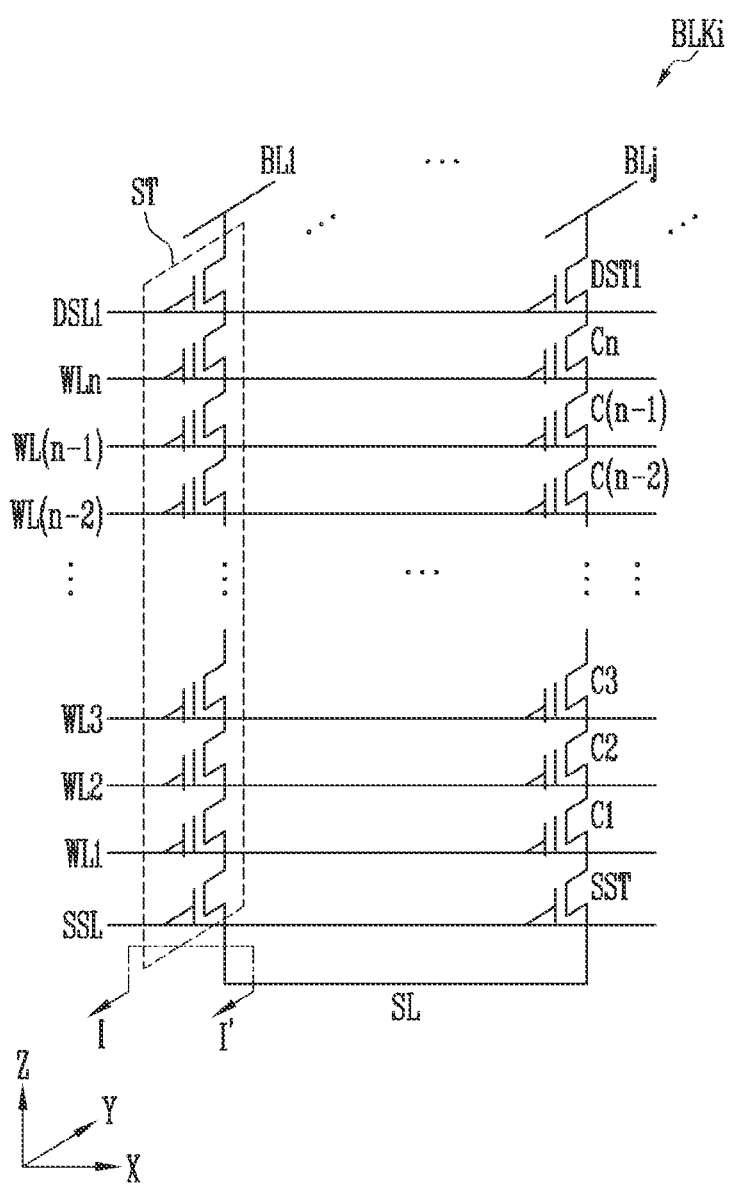
FIG. 3 is a diagram illustrating an ith memory block in accordance with an embodiment of the present disclosure.

FIG. 3 is a diagram illustrating an ith memory block in accordance with an embodiment of the present disclosure.

Referring to FIG. 3, the ith memory block BLKi may include a plurality of memory strings ST connected between first to jth bit lines BL1 to BLj and a source line SL. Each of the memory strings ST may extend along a Z direction. The Z direction may be a direction in which memory cells C1 to Cn are stacked, and be a direction perpendicular to a substrate.

Each of the memory strings ST may include a source select transistor SST, memory cells C1 to Cn, and a first drain select transistor DST1, which are connected in series to each other.

A source select transistor SST included in one memory string ST may be connected between a first memory cell C1 and the source line SL. Gate electrodes of source select transistors SST included in different memory strings ST may be connected to a source select lines SSL. In addition, source select transistors SST located in the same layer may be connected to the same source select line SSL.

First to nth memory cells C1 to Cn included in one memory string ST may be connected in series between the source select transistor SST and the first drain select transistor DST1. Gate electrodes of the first to nth memory cells C1 to Cn may be respectively connected to first to nth word lines WL1 to WLn. Operating voltages (e.g., a program voltage, a pass voltage, a read voltage, a ground voltage, etc.) necessary for driving may be applied to the first to nth word lines WL1 to WLn. A group of memory cells connected to each of the first to nth word lines WL1 to WLn becomes a page. For example, a group of first memory cells C1 connected to the first word line WL1 may constitute one page. A program or read operation of the ith memory block BLKi may be performed in units of pages PG.

A first drain select transistor DST1 included in one memory string ST may be connected between any one of the first to jth bit lines BL1 to BLj and the memory cell Cn. For example, first drain select transistors DST1 included in the ith memory block BLKi may be connected between the first to jth bit lines BL1 to BLj and nth memory cells Cn. Gates of first drain select transistors DST1 included in different memory strings ST may be connected to a first drain select line DSL1.

Figure 4:
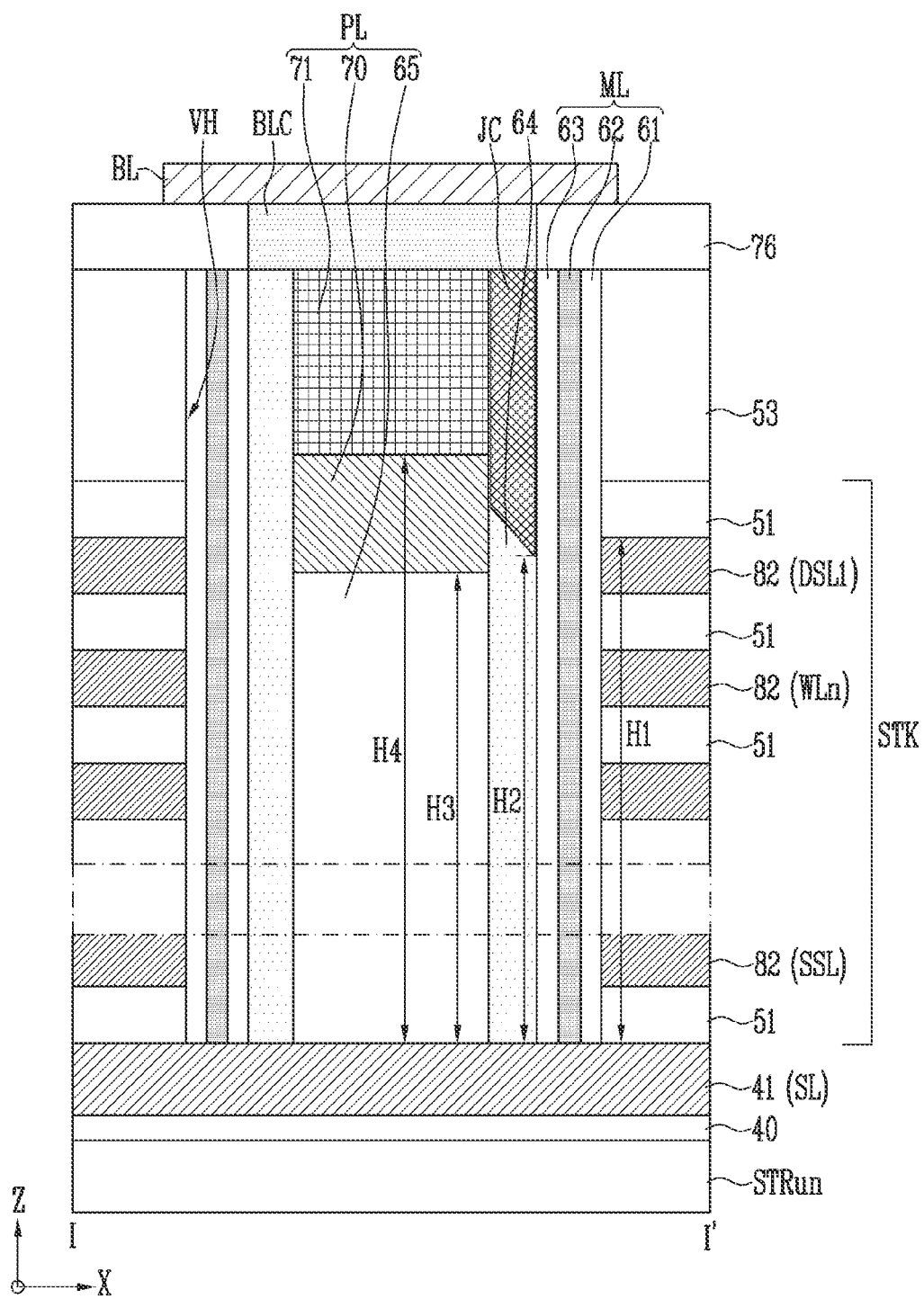
FIG. 4 is a view illustrating a final structure of a memory device in accordance with a first embodiment of the present disclosure.

FIG. 4 is a view illustrating a final structure of a memory device in accordance with a first embodiment of the present disclosure. FIG. 4 illustrates a sectional view in a direction I-I' shown in FIG. 3.

Referring to FIG. 4, a first insulating layer 40 may be formed on a lower structure STRun, and a first conductive layer 41 may be formed on the first insulating layer 40. The lower structure STRun may include a substrate, and include peripheral circuits formed on the substrate. The first insulating layer 40 is a layer for electrically insulating the lower structure STRun and the first conductive layer 41 from each other, and may be formed as an oxide layer. The first conductive layer 41 may be used as a source line SL. A ground voltage or an erase voltage may be applied to the source line SL.

A stack structure STK in which second insulating layers 51 and second conductive layers 82 are alternately stacked may be formed on the top of the first conductive layer 41. For example, the second insulating layer 51 may be formed as an oxide layer, and the second conductive layer 82 may be formed as a tungsten layer. The second conductive layer 82 may be used as a source select line SSL, a word line WLn, or a first drain select line DSL1 according to a position thereof. For example, a conductive layer located at a lowermost end among the second conductive layers 82 may become the source select line SSL, a conductive layer located at an uppermost end among the second conductive layers 82 may become the first drain select line DSL1, and conductive layers located between the source select line SSL and the first drain select line DSL1 among the second conductive layers 82 may become the word line WLn. A third insulating layer 53 may be formed on the top of the stack structure STK.

A vertical hole VH may be formed, which vertically penetrates the third insulating layer 53 and the stack structure STK, and a plug PL having a cylinder shape, and a cylindrical channel layer 64 and a cylindrical memory layer ML, which surround the periphery of the plug PL, may be formed at the inside of the vertical hole VH.

The plug PL may include a fourth insulating layer 65, a second material layer 70, and a capping pattern 71. The fourth insulating layer 65 may be formed as an oxide layer, and be formed as, for example, a silicon dioxide ($SiO_2$) layer. The second material layer 70 may be formed of a fixed negative material. The fixed negative material is a material having a high density of negative charges due to the crystalline structure of a film, and may include, for example, aluminum oxide ($Al_2O_3$). The capping pattern 71 may be configured as a doped semiconductor layer. For example, the capping pattern 71 may include doped silicon doped with an n-type impurity.

The channel layer 64 is a layer in which charges can be moved, and may be formed as, for example, an undoped semiconductor layer. In an embodiment, the undoped semiconductor layer may include an undoped silicon layer. A junction region JC to which a voltage is applied may be formed in the channel layer 64.

The memory layer ML may include a blocking layer 61, a charge trap layer 62, and a tunnel isolation layer 63. The blocking layer 61 may be formed of an insulating material, and be formed as, for example, as an oxide layer. The charge trap layer 62 is a layer for storing data, and may be formed as a nitride layer. For example, in a program operation, electrons having a negative charge may be stored in the charge trap layer 62 by a program voltage. In an erase operation, the electrons stored in the charge trap layer 62 may be discharged to the outside by an erase voltage. The tunnel isolation layer 63 is a layer for isolating the charge trap layer 62 from the channel layer 64, and may be formed as an oxide layer. The tunnel isolation layer 63 may be located between the charge trap layer 62 and the channel layer 64. For example, in the program operation, electrons may be moved to the charge trap layer 62 while passing through the tunnel isolation layer 63 from the channel layer 64. In the erase operation, electrons may be moved to the channel layer 64 from the charge trap layer 62.

A fifth insulating layer 76 may be formed on the top of the third insulating layer 53 and the memory layer ML, and a bit line contact BLC may be formed on the channel layer 64 and the plug PL. The fifth insulating layer 76 may be formed as an oxide layer, and the bit line contact BLC may be formed as a conductive layer.

A bit line BL may be formed on a portion of the fifth insulating layer 76 and the top of the bit line contact BLC. In accordance with this embodiment, the second material layer 70 having a fixed negative charge is included in the plug PL, so that a positive charge moved in the channel layer 64 can be moved adjacent to the memory layer ML. Thus, in the erase operation, electrons trapped in the charge trap layer 62 can be easily discharged.

FIGS. 5 to 15 are views illustrating the memory device in accordance with the first embodiment of the present disclosure and a manufacturing method of the memory device.

Figure 5:
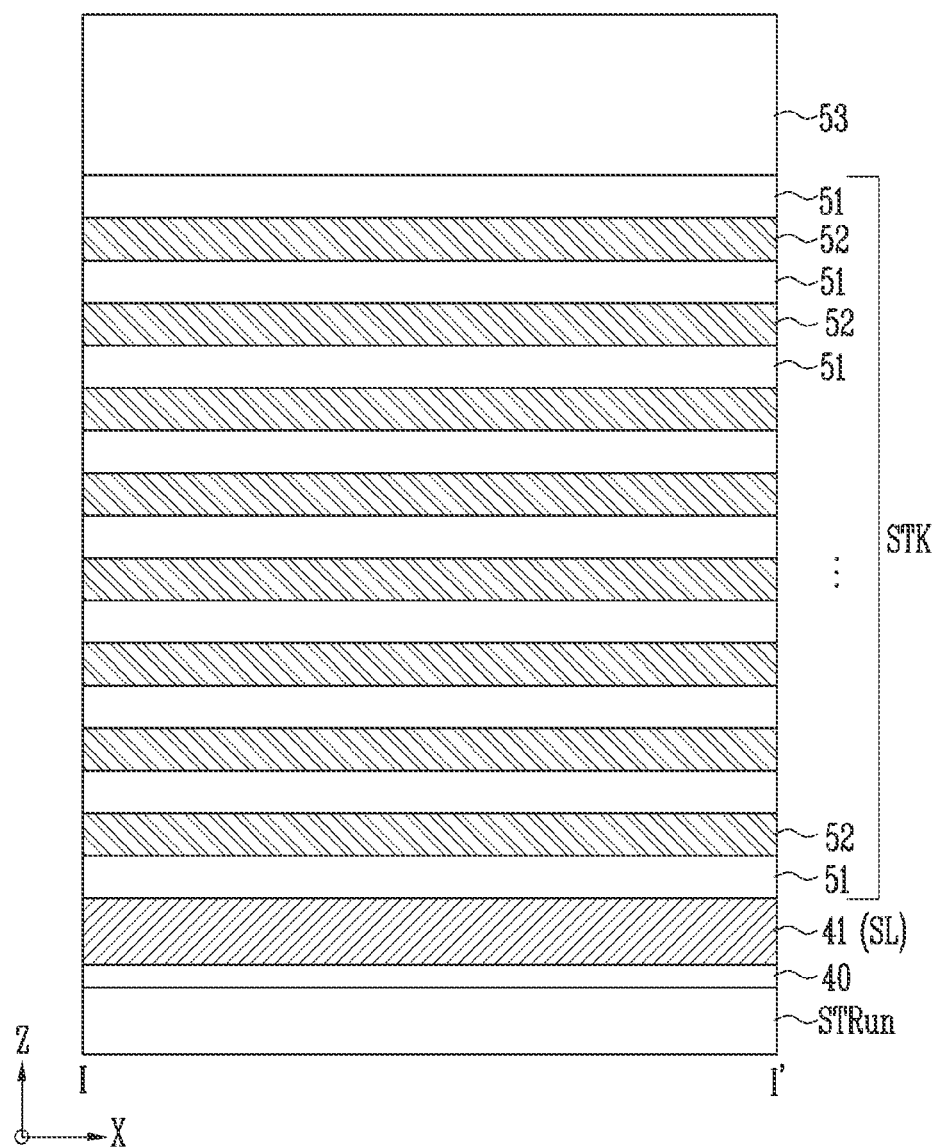
FIGS. 5, 6, 7, 8, 9, 10, 11, 12, 13, 14, and 15 are views illustrating the memory device in accordance with the first embodiment of the present disclosure and a manufacturing method of the memory device.

Referring to FIG. 5, a first insulating layer 40 and a first conductive layer 41 may be formed on a lower structure STRun. The lower structure STRun may include a substrate, and further include peripheral circuits formed on the substrate. The first insulating layer 40 is a layer for electrically insulating the lower structure STRun and the first conductive layer 41 from each other, and may be formed as an oxide layer. The first conductive layer 41 may be used as a source line SL. A ground voltage or an erase voltage may be applied to the source line SL.

A stack structure STK in which second insulating layers 51 and first material layers 52 are alternately stacked may be formed on the top of the first conductive layer 41. The second insulating layer 51 may be formed as an oxide layer, and the first material layer 52 may be formed of a material which is removed in a subsequent process and has an etch selectivity with respect to the second insulating layer 51. For example, the first material layer 52 may be formed as a nitride layer. A third insulating layer 53 may be formed on the top of the stack structure STK. The third insulating layer 53 may be formed as an oxide layer. The third insulating layer 53 may be formed thicker than the second insulating layer 51 included in the stack structure STK so as to suppress an interference phenomenon between a bit line and a drain select line, which are formed in a subsequent process.

Figure 6:
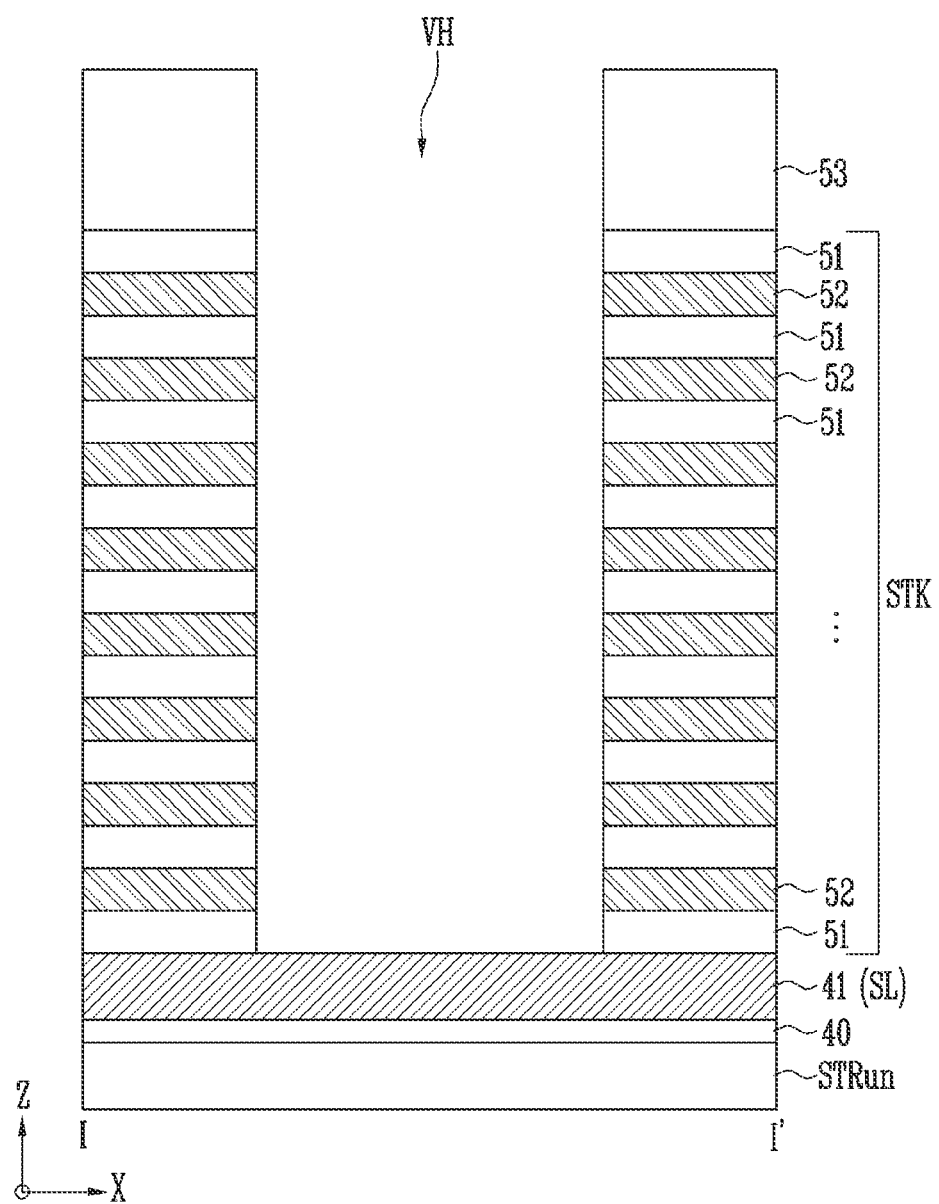

Referring to FIG. 6, a vertical hole VH may be formed in the third insulating layer 53 and the stack structure STK. For example, the vertical hole VH having a cylinder shape may be formed by forming a mask pattern (not shown) including an opening on the top of the third insulating layer 53 and etching the third insulating layer 53 and the stack structure STK, which are exposed through the opening. The first conductive layer 41 may be exposed through a bottom surface of the vertical hole VH.

Figure 7:
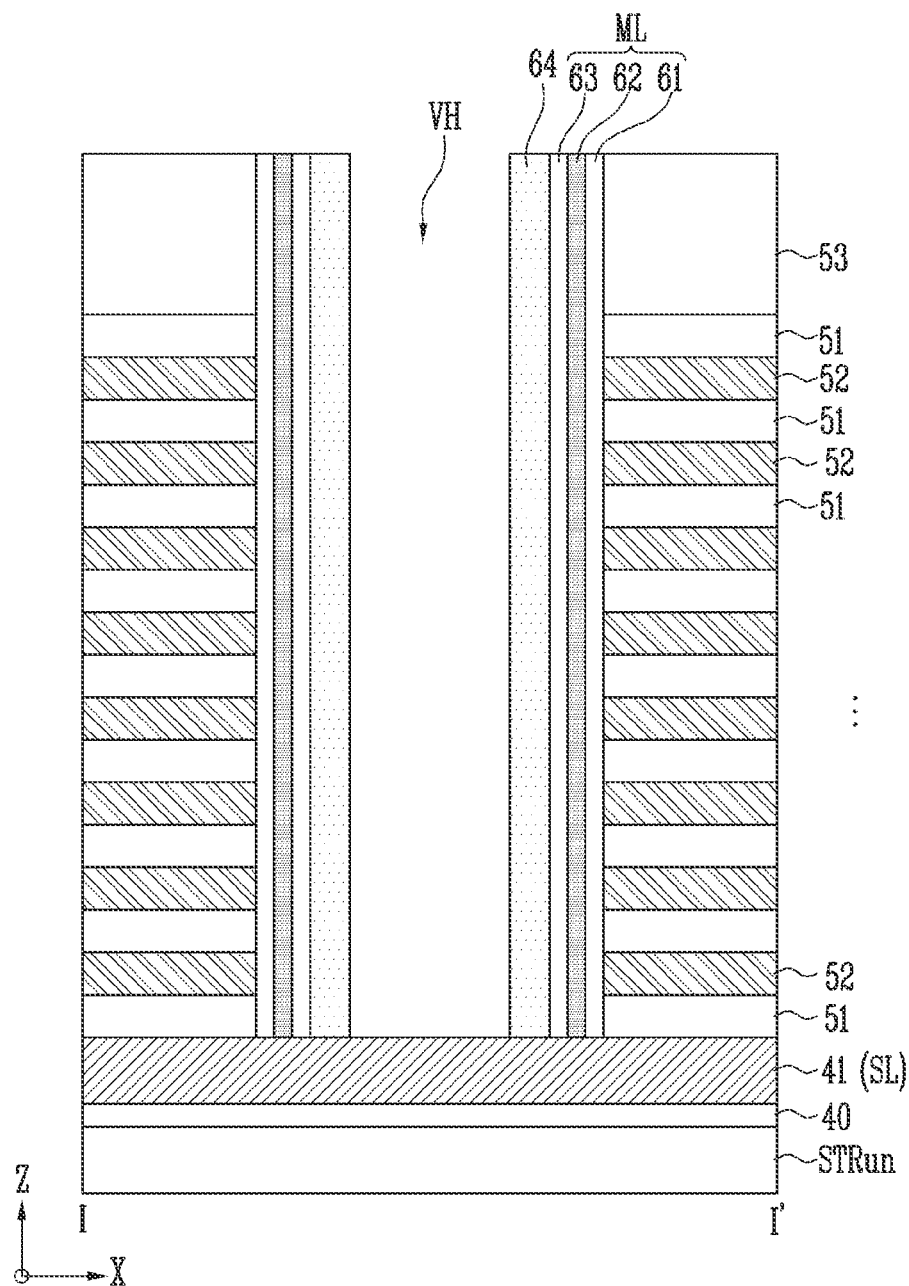

Referring to FIG. 7, a memory layer ML and a channel layer 64 may be formed on a side surface of the vertical hole VH. The memory layer ML may include a blocking layer 61, a charge trap layer 62, and a tunnel isolation layer 63. The blocking layer 61 may be formed of an insulating material, and be formed as, for example, as an oxide layer. The charge trap layer 62 is a layer for storing data, and may be formed as a nitride layer. For example, in a program operation, electrons having a negative charge may be stored in the charge trap layer 62 by a program voltage. In an erase operation, the electrons stored in the charge trap layer 62 may be discharged to the outside by an erase voltage. The tunnel isolation layer 63 is a layer for isolating between the charge trap layer 62 and the channel layer 64, and may be formed as an oxide layer. For example, in the program operation, electrons may be moved to the charge trap layer 62 while passing through the tunnel isolation layer 63 from the channel layer 64. In the erase operation, electrons may be moved to the channel layer 64 from the charge trap layer 62. The channel layer 64 is a layer in which charges can be moved, and may be formed as, for example, an undoped semiconductor layer. In an embodiment, the undoped semiconductor layer may include an undoped silicon layer.

Figure 8:
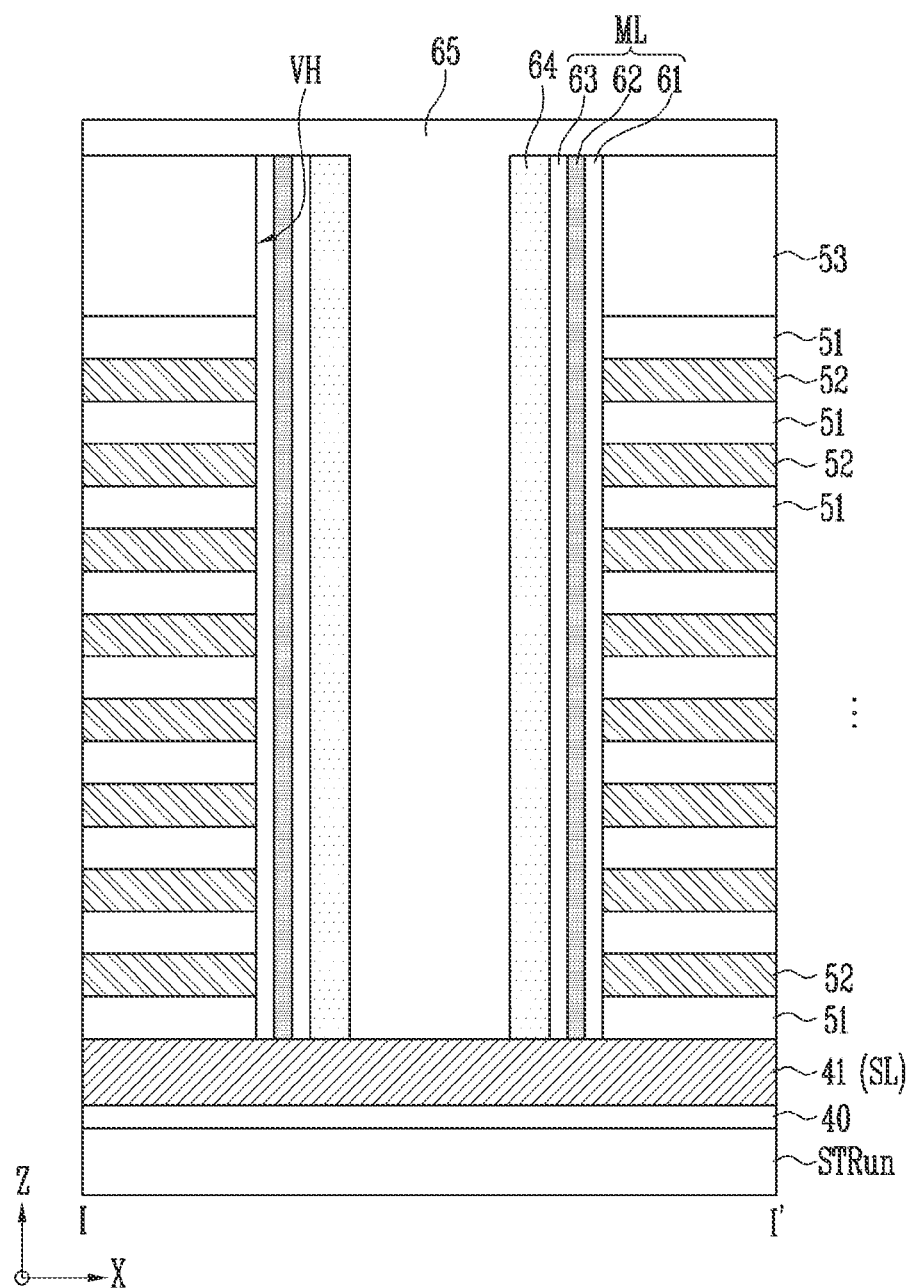

Referring to FIG. 8, a fourth insulating layer 65 may be formed on the entire structure to fill the inside of the vertical hole VH. For example, the fourth insulating layer 65 may be formed as a silicon oxide layer $SiO_2$. The fourth insulating layer 65 may be formed such that the third insulating layer 53 is entirely covered to sufficiently fill the inside of the vertical hole VH.

Figure 9:
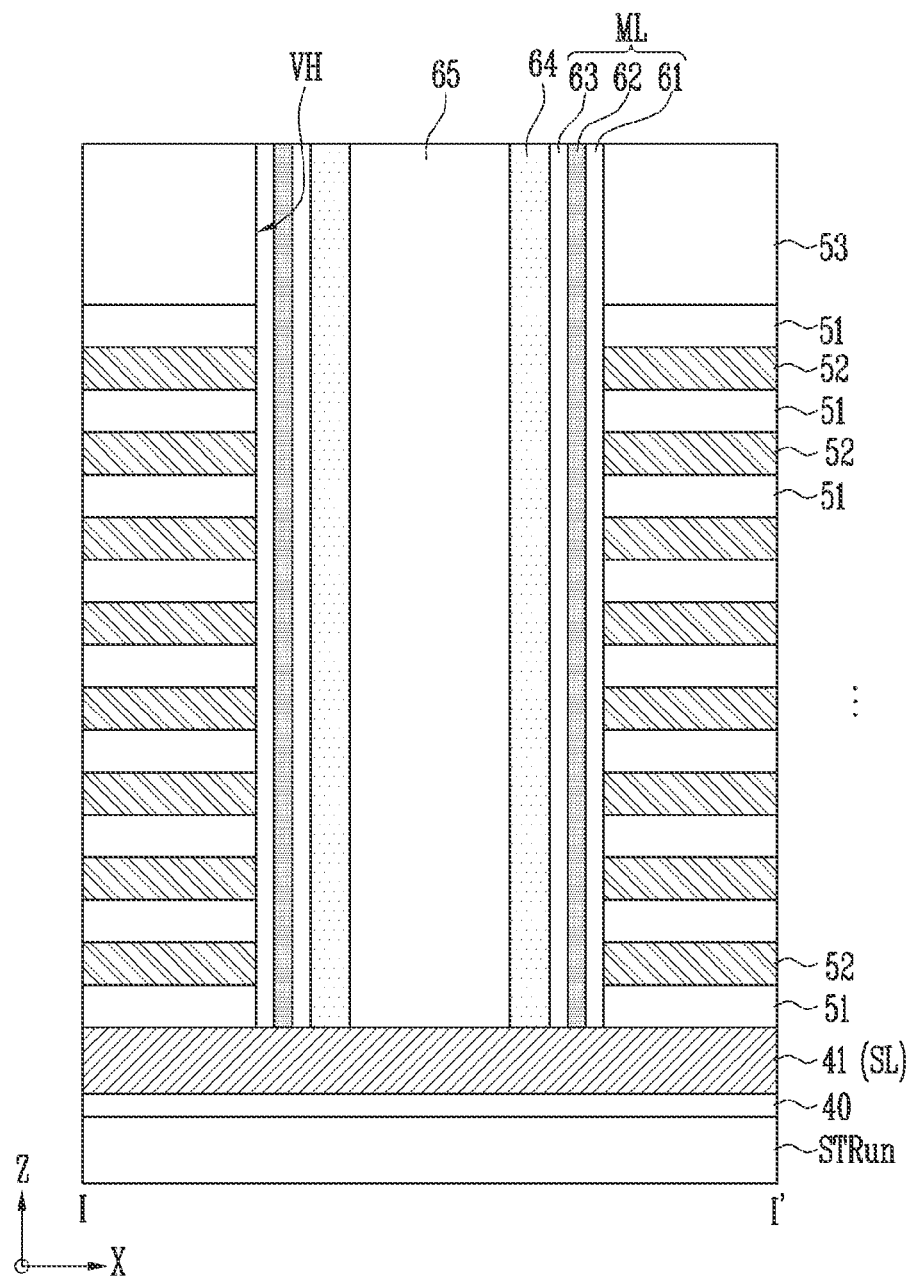

Referring to FIG. 9, a planarization process may be performed such that a top surface of the third insulating layer 53 is exposed. After the planarization process, portions of the third insulating layer 53, the blocking layer 61, the charge trap layer 62, the tunnel isolation layer 63, the channel layer 64, and the fourth insulating layer 65 may be exposed on the top of the entire structure.

Figure 10:
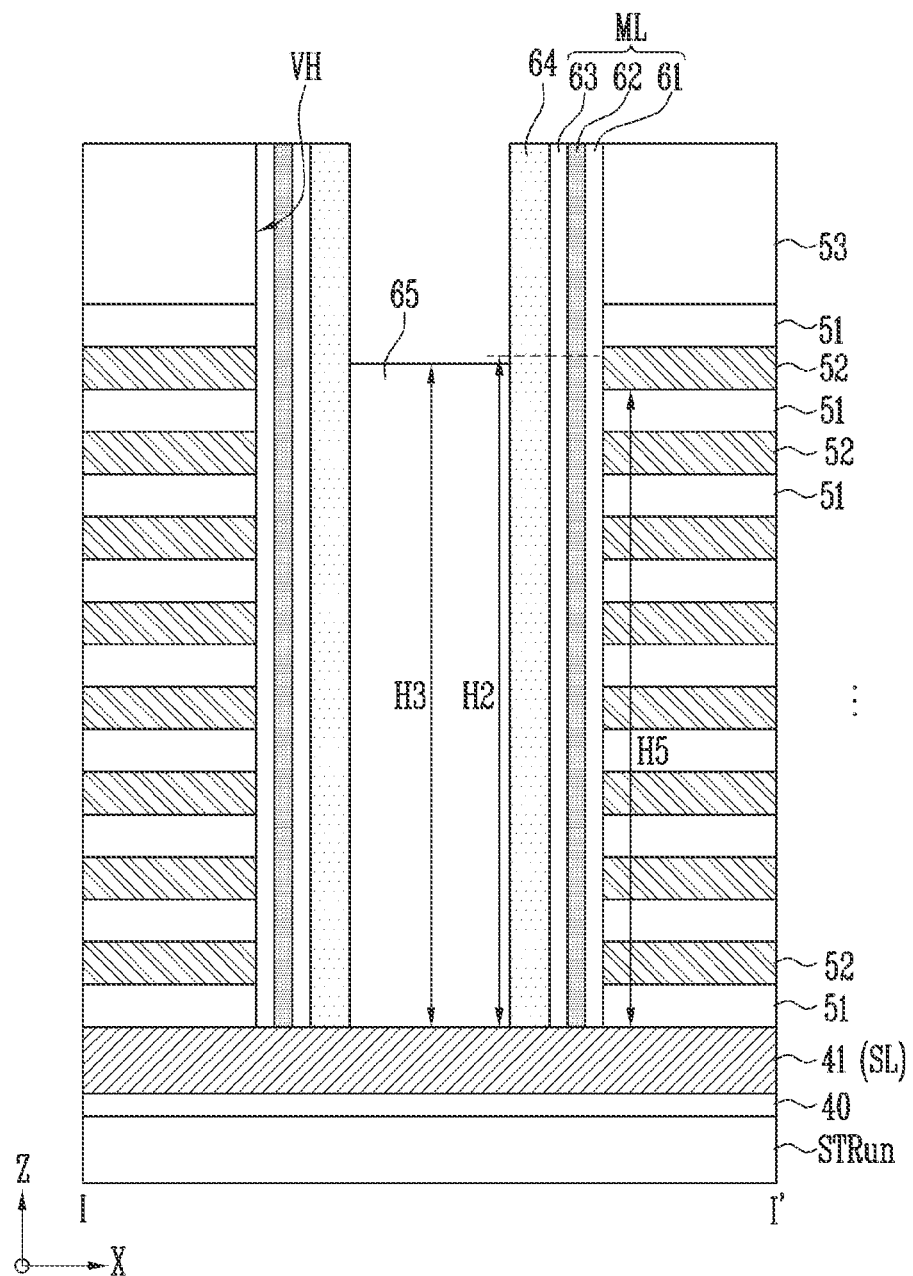

Referring to FIG. 10, an etching process for decreasing a height of the fourth insulating layer 65 may be performed. For example, the etching process may be performed as a dry etching process for selectively etching only the fourth insulating layer 65. The etching process may be performed such that a height of the fourth insulating layer 65 is lower than a second height H2 and is higher than a fifth height H5. The second height H2 may be a height from a bottom surface of the stack structure STK to a position at which a channel can be formed in the channel layer 64, and the fifth height H5 may be a height from the bottom surface of the stack structure STK to a bottom surface of the first material layer 52 located at an uppermost end among the first material layers 52. That is, a third height H3 may be determined between the fifth height H5 and the second height H2.

Figure 11:
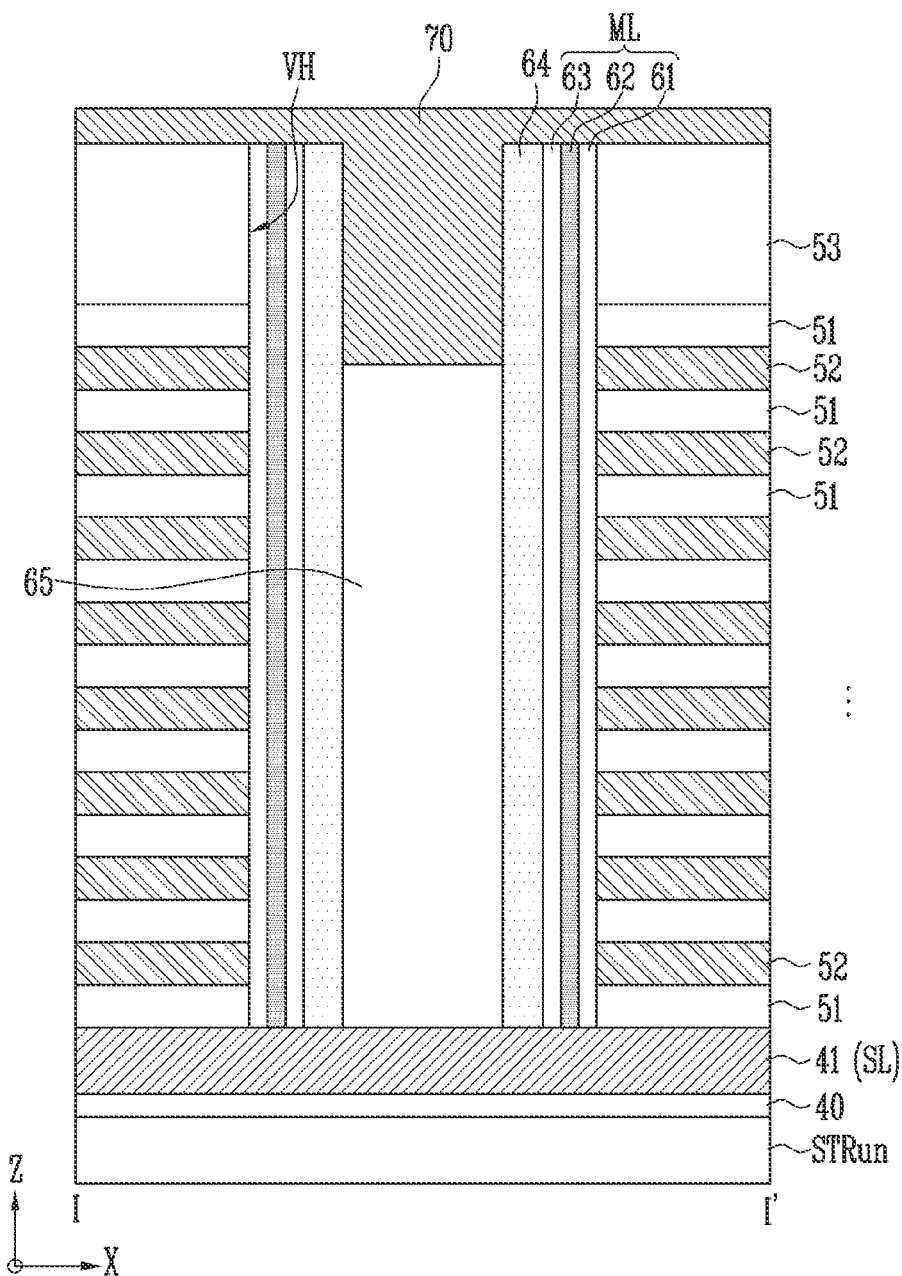

Referring to FIG. 11, a second material layer 70 may be formed on the entire structure to fill an upper region of the fourth insulating layer 65. The second material layer 70 may be formed of a material for increasing a current amount in the channel layer 64 in an erase operation. For example, the second material layer 70 may be formed of a material having a fixed negative charge. For example, the second material layer 70 may be formed as an Al$_2$O$_3$ layer having the fixed negative charge. The second material layer 70 may be formed such that the entire structure is entirely covered to sufficiently fill a region of the vertical hole VH on the top surface of the fourth insulating layer 65.

Figure 12:
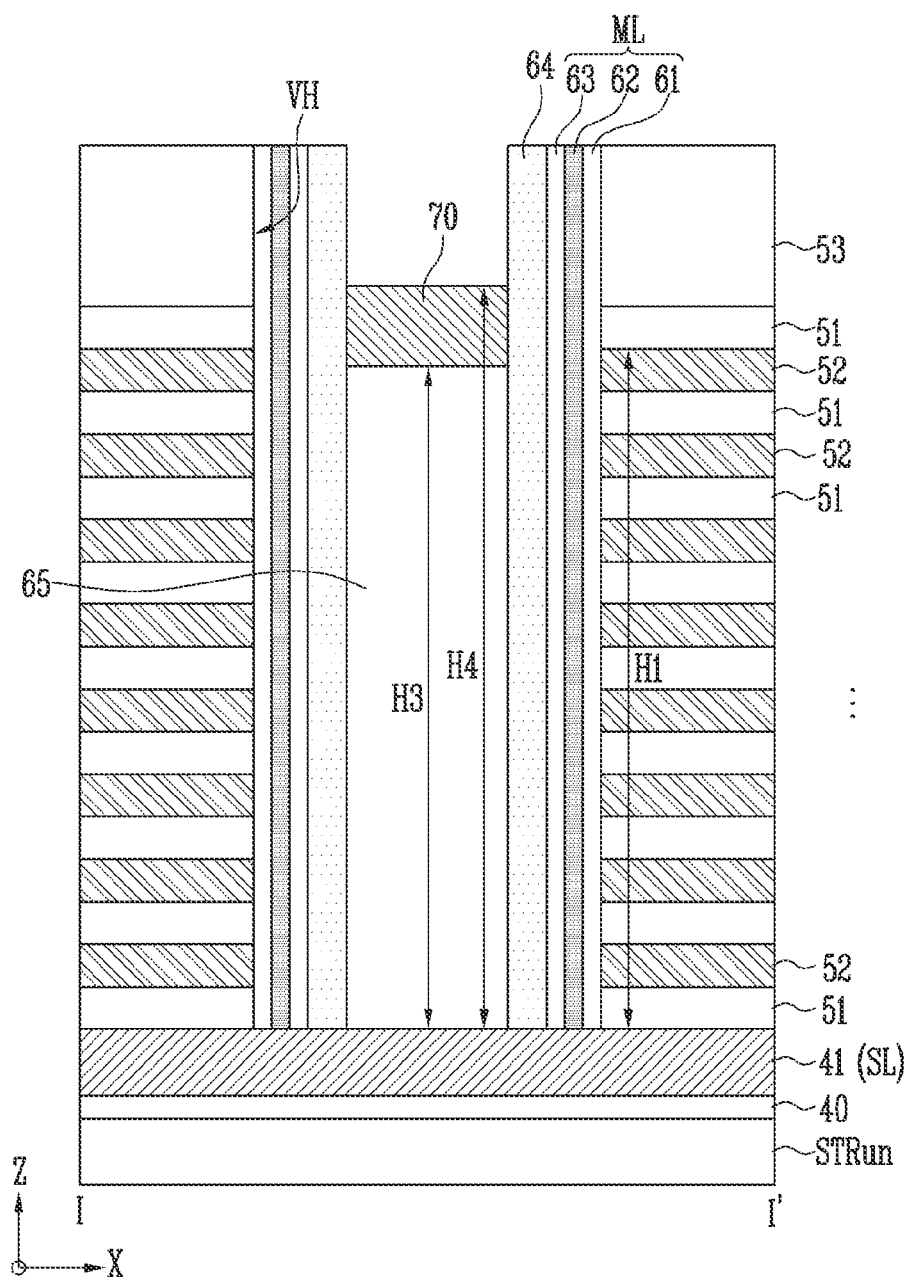

Referring to FIG. 12, an etching process for adjusting a thickness of the second material layer 70 may be performed. For example, the etching process may be performed as a dry etching process for selectively etching the second material layer 70. The etching process may be performed such that a top surface of the second material layer 70 has a fourth height H4 higher than a first height H1. In an embodiment, the fourth height H4 may be a height from the top surface of the second material layer 70 to the top surface of the first conductive layer 41. The first height H1 may be a height from the bottom surface of the stack structure STK to the top of the first material layer 52. Therefore, a thickness of the second material layer 70 remaining after the etching process may be a height obtained by subtracting the third height H3 from the fourth height H4. In an embodiment, the third height H3 may be a height from the bottom surface of the second material layer 70 to the top surface of the first conductive layer 41.

Figure 13:
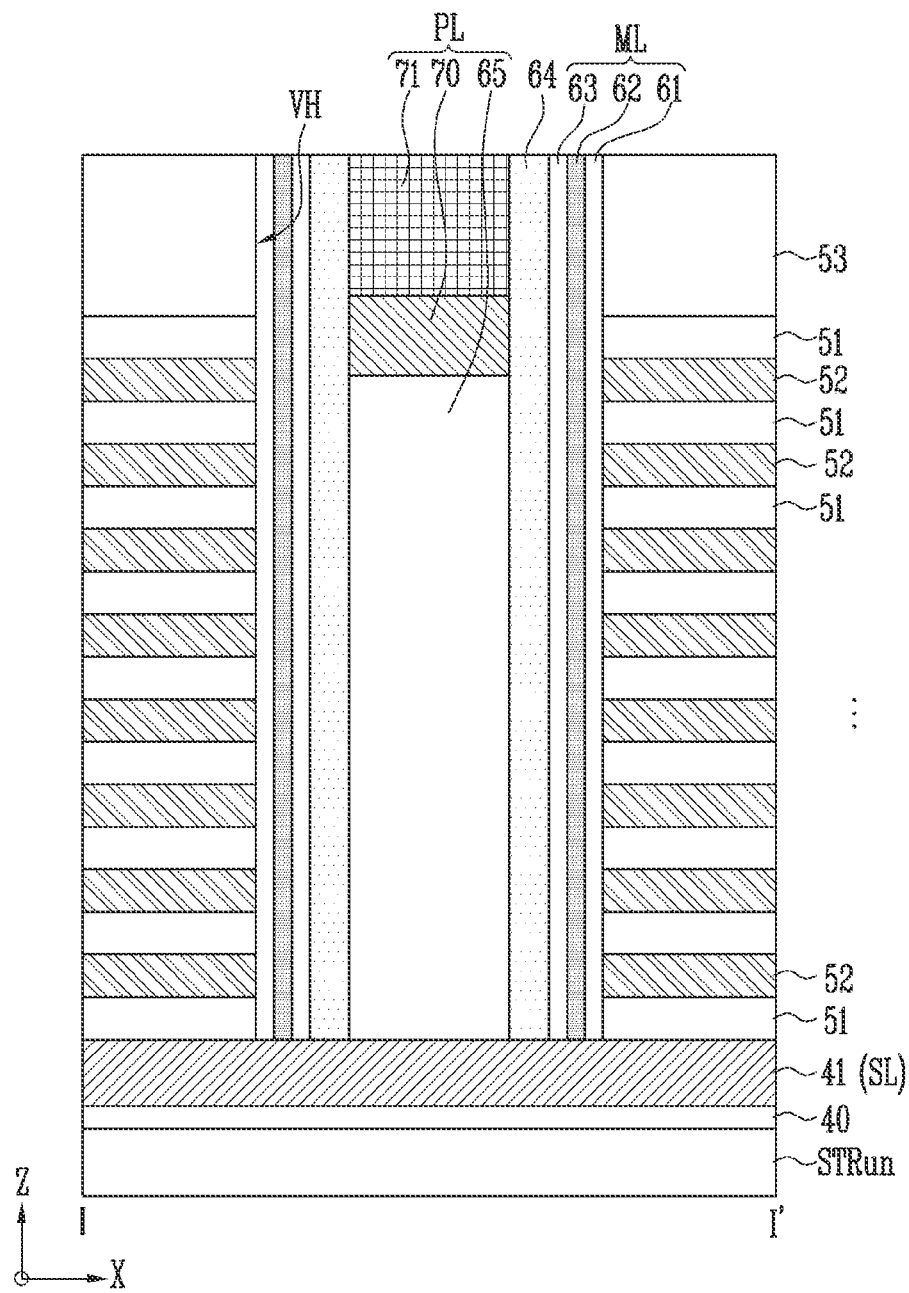

Referring to FIG. 13, a capping pattern 71 for filling an upper region of the second material layer 70 may be formed. The capping pattern 71 may be configured as a doped semiconductor layer. For example, the capping pattern 71 may include doped silicon doped with an n-type impurity. For example, the capping pattern 71 may be formed such that a top surface of the entire structure is entirely covered to sufficiently fill the upper region of the second material layer 70. After the capping pattern 71 is formed, a planarization process may be performed until the top surface of the third insulating layer 53 is exposed. Accordingly, a plug PL may be formed, which includes the fourth insulating layer 65, the second material layer 70, and the capping pattern 71. That is, the plug PL may be formed in a cylinder shape, and the channel layer 64, the tunnel insolation layer 63, the charge trap layer 62, and the blocking layer 61 may be formed in a cylindrical shape to sequentially surround the plug PL.

Figure 14:
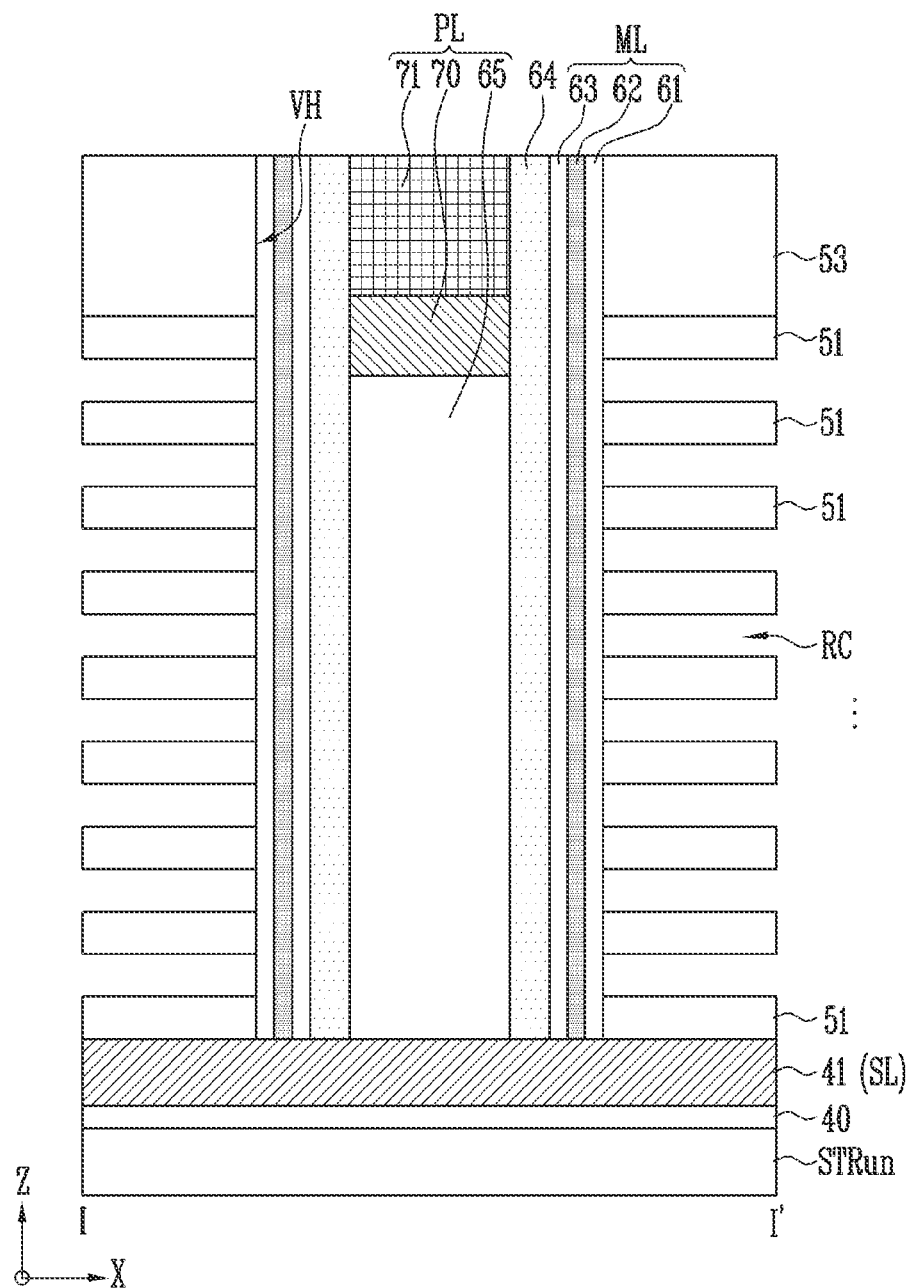

Referring to FIG. 14, an etching process for removing the first material layer (52 shown in FIG. 13) may be performed. The etching process may be performed as a wet etching process to remove all the first material layers 52 formed between the second insulating layers 51. Each of spaces between the second insulating layers 51, in which the first material layers 52 are removed may be defined as a recess RC.

Figure 15:
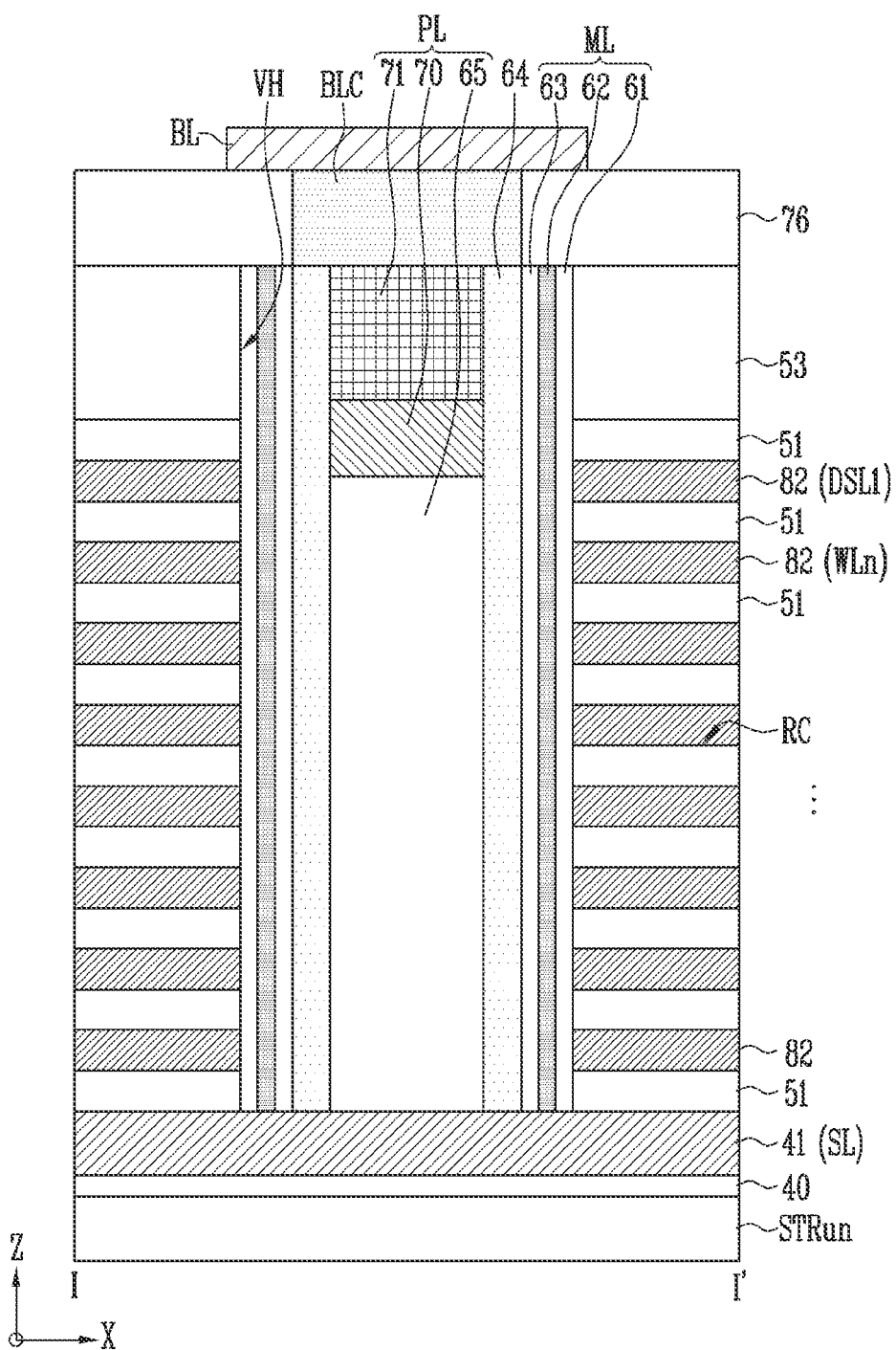

Referring to FIG. 15, a second conductive layer 82 may be formed in each of the recesses RC. For example, the second conductive layer 82 may be formed of tungsten. Although not shown in the drawing, a barrier layer may be further formed along an internal surface of the recess RC before the second conductive layer 82 is formed.

At least one of the second conductive layers 82 may be used as a first drain select line DSL1, some of the second conductive layers 82 may be used as word lines WLn, and at least one of the second conductive layers 82 may be used as a source select line. For example, a conductive layer located at an uppermost end among the second conductive layers 82 may become the first drain select line DSL1, and conductive layers located under the first drain select line DSL1 may be used as the word lines WLn. A conductive layer located at a lowermost end among the second conductive layers 82 may be used as the source select line.

A fifth insulating layer 76 for interlayer insulating layers may be formed on the top of the third insulating layer 53 and the memory layer ML, and a bit line contact BLC may be formed on the top of the channel layer 64 and the plug PL. The fifth insulating layer 76 may be formed as an oxide layer, and the bit line contact BLC may be formed as a conductive layer.

A bit line BL may be formed on a portion of the fifth insulating layer 76 and the top of the bit line contact BLC. The bit line contact BLC may electrically connect the bit line BL and the channel layer 64.

Figure 16:
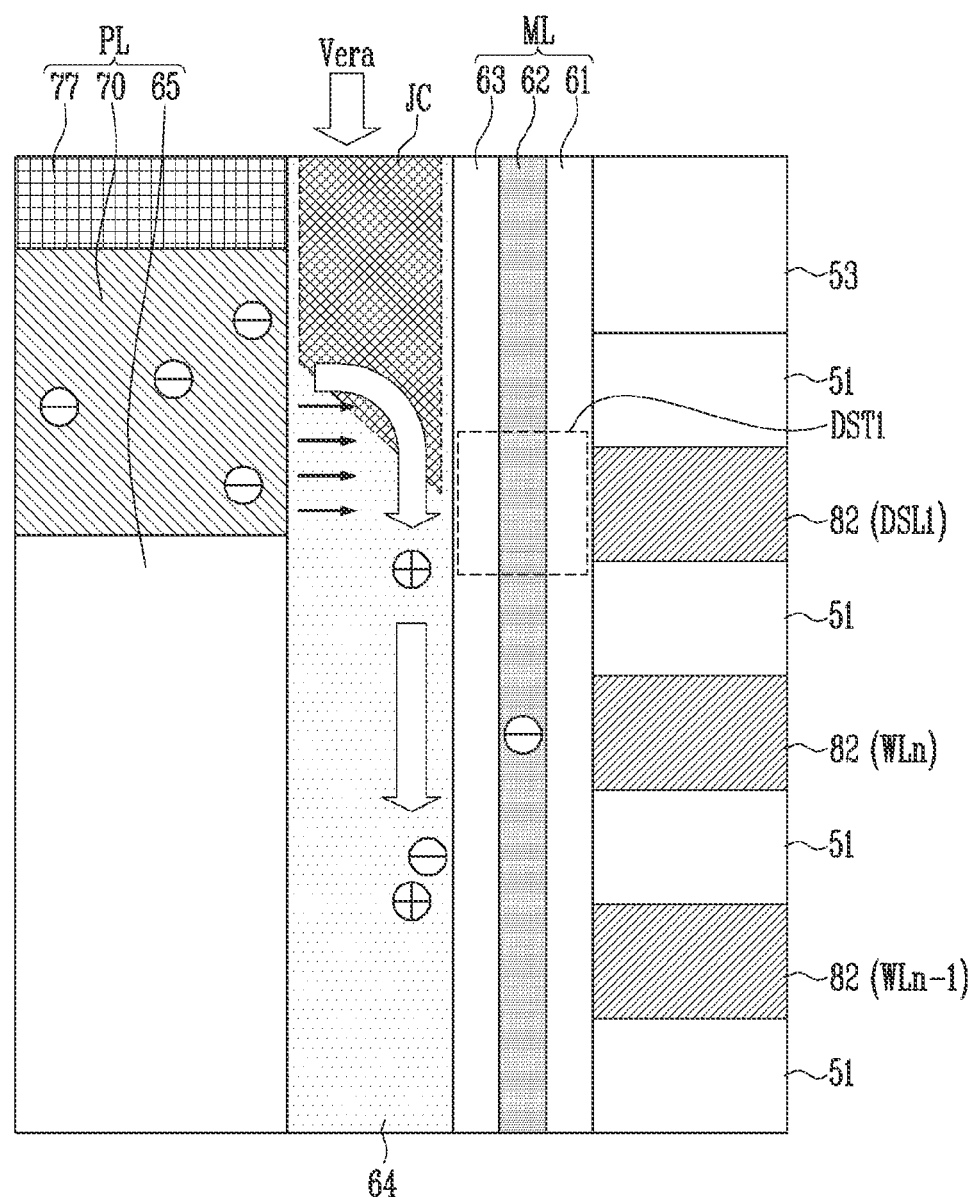
FIG. 16 is a view illustrating an effect in accordance with the present disclosure.

FIG. 16 is a view illustrating an effect in accordance with the present disclosure.

Referring to FIG. 16, when the conductive layer located at the uppermost end among the second conductive layers 82 is used as the first drain select line DSL1, the memory layer ML connected to the first drain select line DSL1 becomes a first drain select transistor DST1, and therefore, a junction region JC may be formed in a region partially overlapping with the top of the first drain select transistor DST1 in the channel layer 64. The junction region JC may be a region to which a voltage is applied. An erase operation will be described as an example. In the erase operation, an erase voltage Vera having a high positive voltage may be applied to the channel layer 64. The first drain select line DSL1 may be floated after the positive voltage is applied to the first drain select line DSL1 for a certain time. A current may flow through the channel layer 64 due to a voltage difference between the erase voltage Vera applied to the channel layer 64 and the voltage of the first drain select line DSL1, and a positive charge (+) generated in the channel layer 64 may become distant from the plug PL due to the second material layer 70 having a fixed negative charge (−). That is, the positive charge (+) generated in the channel layer 64 can be moved adjacent to the memory layer ML by the second material layer 70, and hence electrons (−) trapped in the charge trap layer 62 of the memory layer ML can be easily discharged by the positive charge (+). Thus, the erase operation of the memory device can be easily performed by the second material layer 70 having the fixed negative charge (−).

Based on the above-described first embodiment, the second material layer 70 may be formed in various structures. Various embodiments associated with this will be described as follows.

Figure 17:
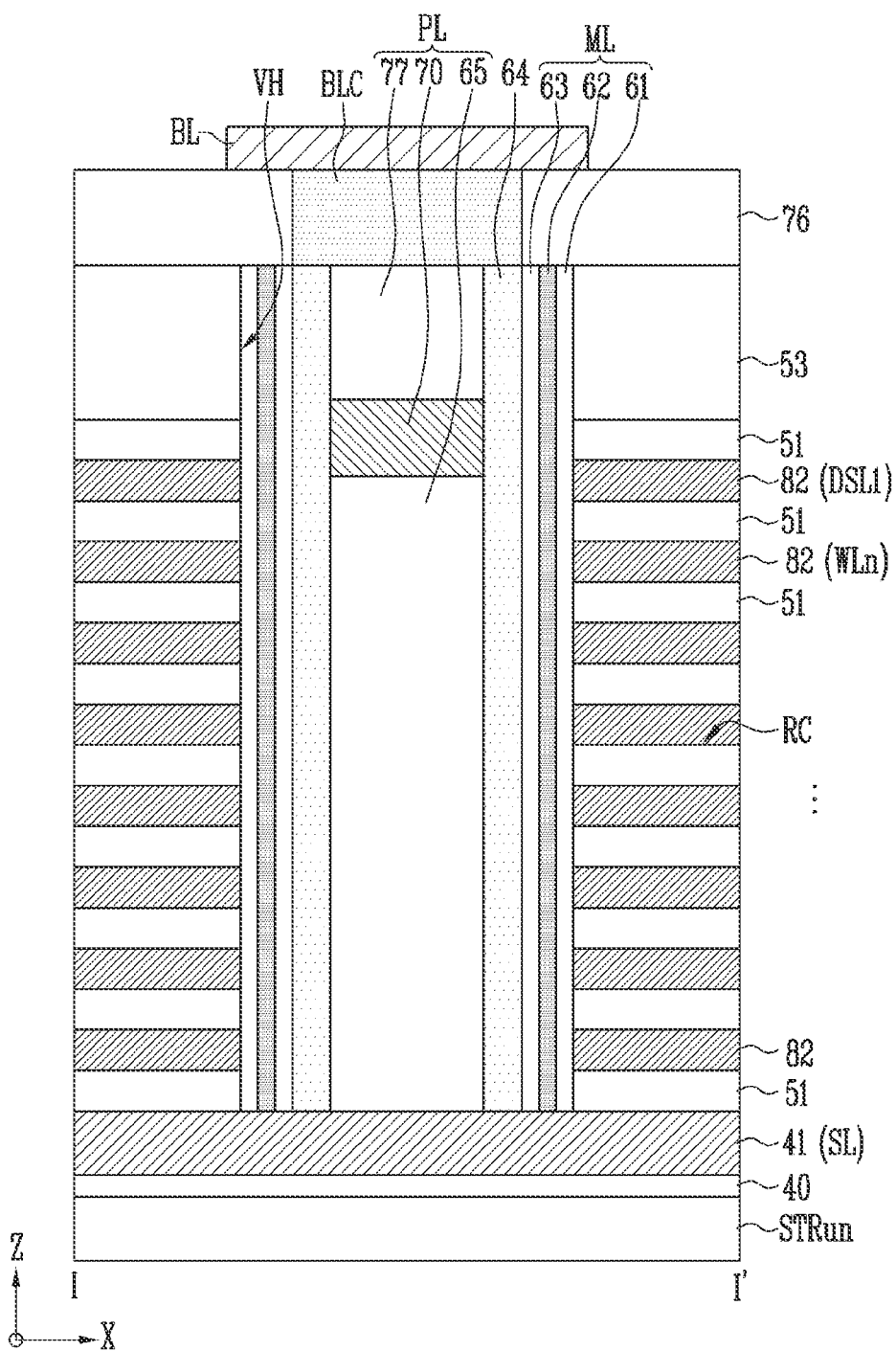
FIG. 17 is a view illustrating a memory device in accordance with a second embodiment of the present disclosure.

FIG. 17 is a view illustrating a memory device in accordance with a second embodiment of the present disclosure.

Referring to FIG. 17, in the memory device in accordance with the second embodiment of the present disclosure, the other structures except a plug PL are identical to the final structure of the first embodiment shown in FIG. 15, and therefore, descriptions of the other structures except the plug PL will be omitted. In the second embodiment, the plug PL may include a fourth insulating layer 65, a second material layer 70, and a sixth insulating layer 77. For example, the plug PL may be formed in a structure in which the second material layer 70 is formed on the top of the fourth insulating layer 65 and the sixth insulating layer 77 is formed on the top of the second material layer 70. The sixth insulating layer 77 may be formed as an oxide layer, and be formed as, for example, a $SiO_2$ layer. A fifth insulating layer 76 may be formed on the top of a third insulating layer 53 and a memory layer ML, and a bit line contact BLC may be formed on the top of the channel layer 64 and the plug PL. A bit line BL may be formed on a portion of the fifth insulating layer 76 and the top of the bit line contact BLC.

Figure 18:
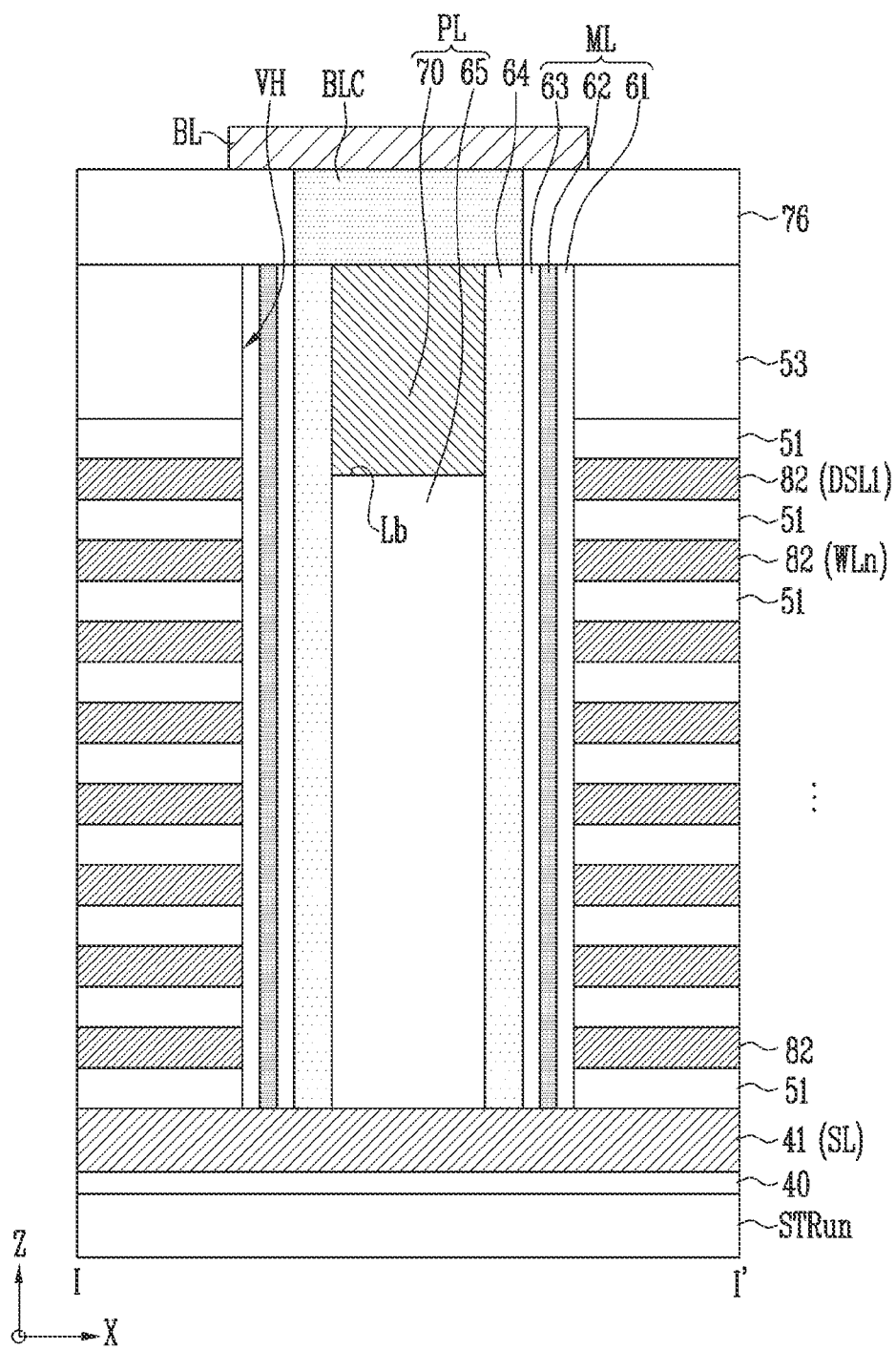
FIG. 18 is a view illustrating a memory device in accordance with a third embodiment of the present disclosure.

FIG. 18 is a view illustrating a memory device in accordance with a third embodiment of the present disclosure.

Referring to FIG. 18, in the memory device in accordance with the third embodiment of the present disclosure, the other structures except a plug PL are identical to the final structure of the first embodiment shown in FIG. 15, and therefore, descriptions of the other structures except the plug PL will be omitted. In the third embodiment, the plug PL does not include the capping pattern (71 shown in FIG. 15), and may be configured with a fourth insulating layer 65 and a second material layer 70. For example, the plug PL may be formed in a structure in which the second material layer 70 is formed on the top of the fourth insulating layer 65. A height of a bottom surface Lb of the second material layer 70 may be located between a bottom surface and a top surface of a first drain select line DSL1. A fifth insulating layer 76 may be formed on the top of a third insulating layer 53 and a memory layer ML, and a bit line contact BCL may be formed on the top of a channel layer 64 and the plug PL. A bit line BL may be formed on a portion of the fifth insulating layer 76 and the top of the bit line contact BCL.

Figure 19:
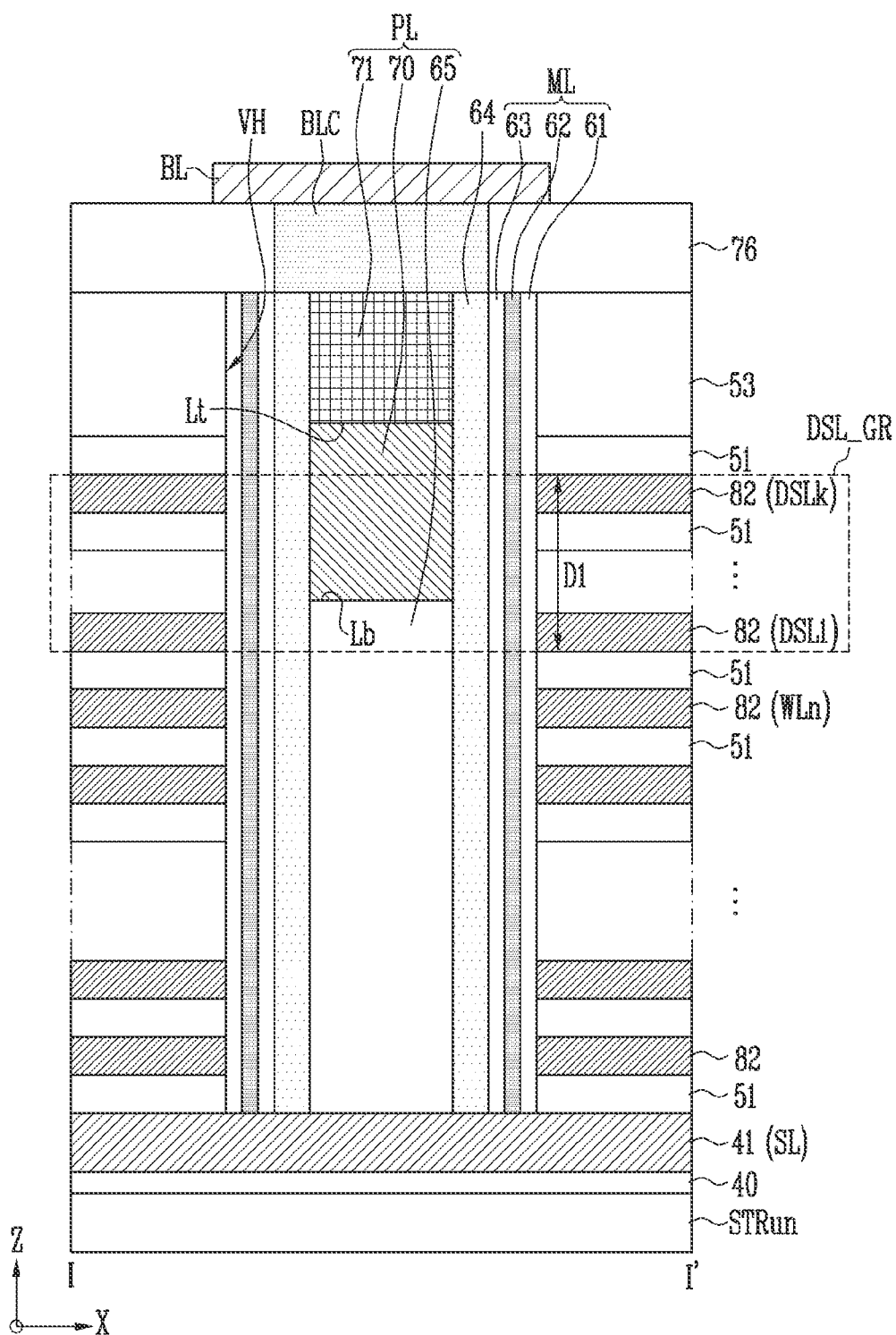
FIG. 19 is a view illustrating a memory device in accordance with a fourth embodiment of the present disclosure.

FIG. 19 is a view illustrating a memory device in accordance with a fourth embodiment of the present disclosure.

Referring to FIG. 19, in the memory device in accordance with the fourth embodiment of the present disclosure, the other structures except drain select lines DSL1 to DSLk and a plug PL are identical to the final structure of the first embodiment shown in FIG. 15, and therefore, descriptions of the other structures except the drain select lines DSL1 to DSLk and the plug PL will be omitted. In the fourth embodiment, apart from the first embodiment, a plurality of drain select lines DSL1 to DSLk may be included in the memory device. For example, first to kth drain select lines DSL1 to DSLk may be sequentially disposed in an upper region of a word line WLn. The first to kth drain select lines DSL1 to DSLk may become a drain select line group DSL_GR. The first drain select line DSL1 may be disposed at a lowermost end, and the kth drain select line DSLk may be disposed at an uppermost end.

The plug PL may include a fourth insulating layer 65, a second material layer 70, and a capping pattern 71. That is, since the second material layer 70 is disposed between the fourth insulating layer 65 and the capping pattern 71, a position of the second material layer 70 may be changed according to positions of the first to kth drain select lines DSL1 to DSLk in the fourth embodiment. For example, a height of a bottom surface Lb of the second material layer 70 may be located in a space D1 between a bottom surface of the first drain select line DSL1 and a top surface of the kth drain select line DSLk, and a height of a top surface Lt of the second material layer 70 may be located in an upper region of the kth drain select line DSLk.

Figure 20:
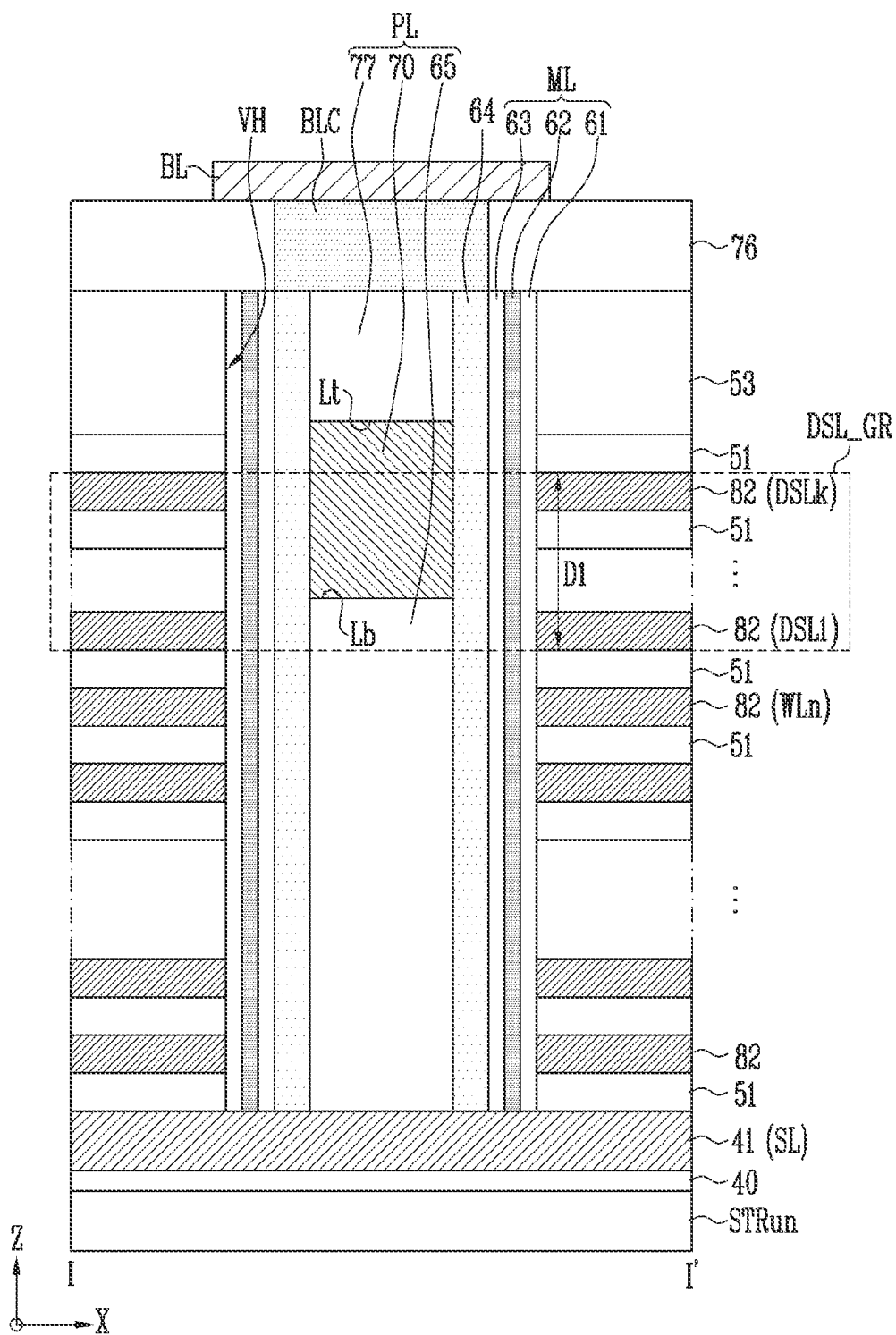
FIG. 20 is a view illustrating a memory device in accordance with a fifth embodiment of the present disclosure.

FIG. 20 is a view illustrating a memory device in accordance with a fifth embodiment of the present disclosure.

Referring to FIG. 20, in the memory device in accordance with the fifth embodiment of the present disclosure, the other structures except a plug PL are identical to the final structure of the fourth embodiment shown in FIG. 19, and therefore, descriptions of the other structures except the plug PL will be omitted. In the fifth embodiment, apart from the fourth embodiment, a sixth insulating layer 77 instead of the capping pattern (71 shown in FIG. 19) may be included in the plug PL. That is, since a second material layer 70 is disposed between a fourth insulating layer 65 and the sixth insulating layer 77, a position of the second material layer 70 may be changed according to positions of first to kth drain select lines DSL1 to DSLk in the fifth embodiment. For example, a bottom surface Lb of the second material layer 70 may be located between a bottom surface of the first drain select line DSL1 and a top surface of the kth drain select line DSLk, and a top surface Lt of the second material layer 70 may be located in an upper region of the kth drain select line DSLk.

Figure 21:
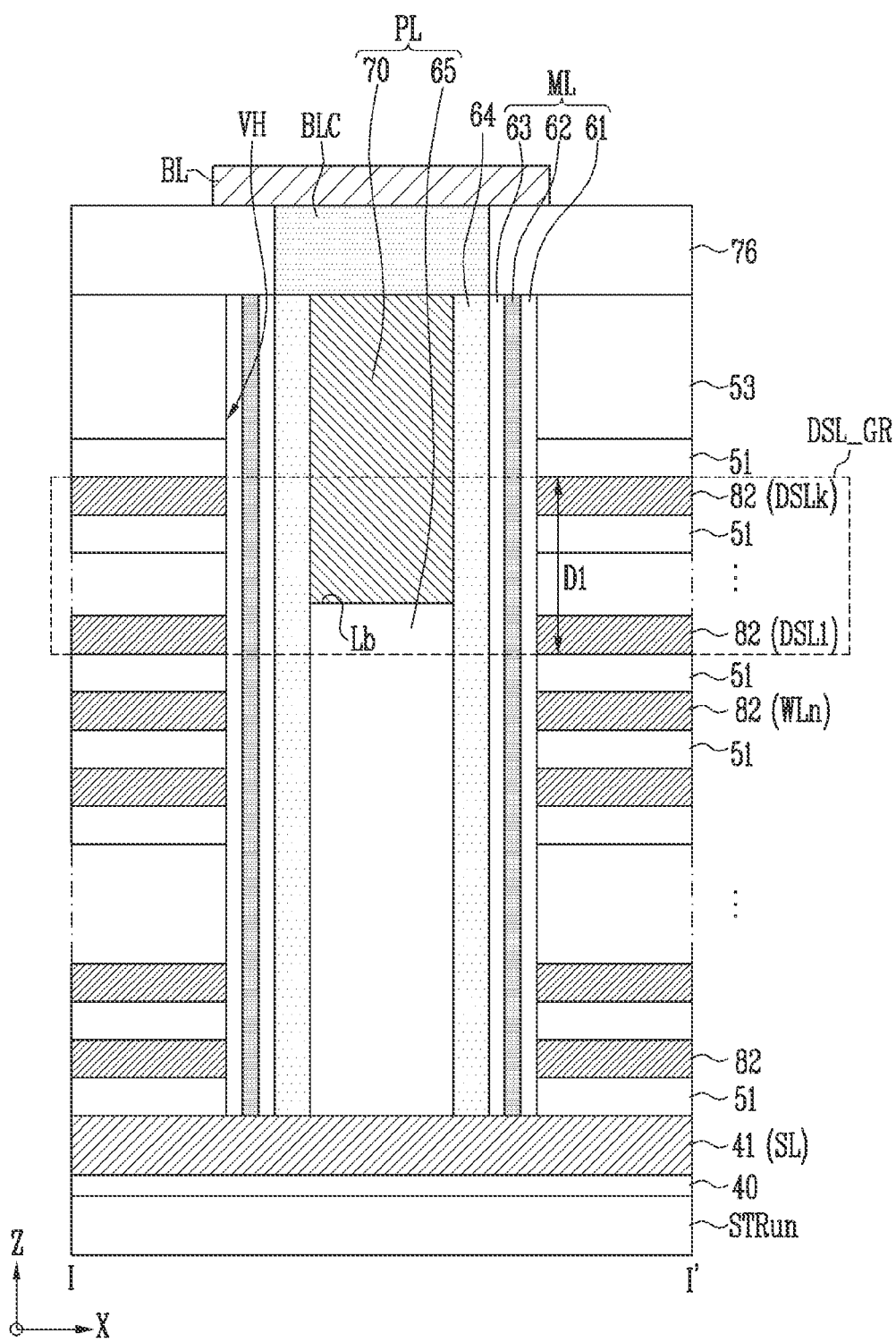
FIG. 21 is a view illustrating a memory device in accordance with a sixth embodiment of the present disclosure.

FIG. 21 is a view illustrating a memory device in accordance with a sixth embodiment of the present disclosure.

Referring to FIG. 21, in the memory device in accordance with the sixth embodiment of the present disclosure, the other structures except a plug PL are identical to the final structure of the fifth embodiment shown in FIG. 20, and therefore, descriptions of the other structures except the plug PL will be omitted. In the sixth embodiment, the plug PL does not include the sixth insulating layer (77 shown in FIG. 20), and may include a fourth insulating layer 65 and a second material layer 70. For example, the plug PL may be formed in a structure in which the second material layer 70 is formed on the top of the fourth insulating layer 65. In this structure, a bottom surface Lb of the second material layer 70 may be located in a space D1 between a bottom surface of a first drain select line DSL1 and a top surface of a kth drain select line DSLk.

Figure 22:
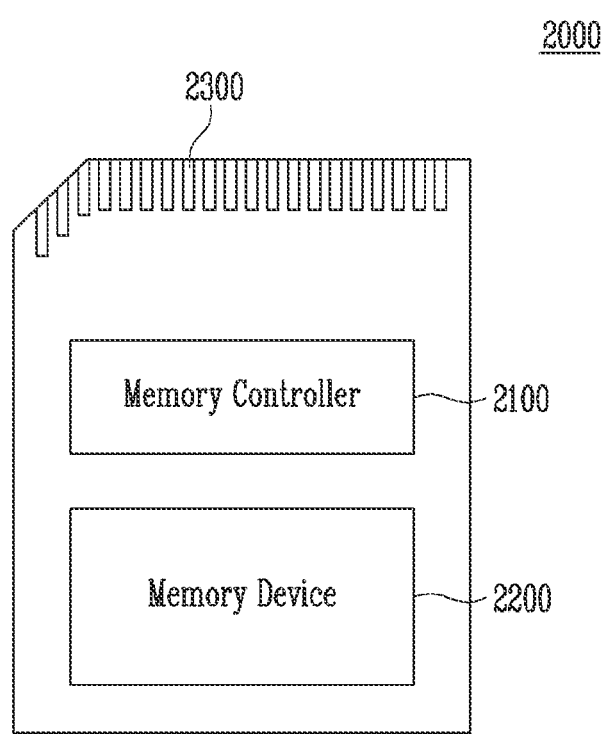
FIG. 22 is a diagram illustrating a memory card system to which the memory device of the present disclosure is applied.

FIG. 22 is a diagram illustrating a memory card system to which the memory device of the present disclosure is applied.

Referring to FIG. 22, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control a program, read or erase operation of the memory device 2200, or control a background of the memory device 2200. The memory controller 2100 provides an interface between the memory device 2200 and a host Host. The memory controller 2100 drives firmware for controlling the memory device 2200. The memory device 2200 may be configured identically to the memory device 1100 described with reference to FIG. 1.

The memory controller 2100 may communicate with an external device through the connector 2300. The memory controller 2100 may communicate with the external device (e.g., the host) according to a specific communication protocol. Exemplarily, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 2300 may be defined by at least one of the above-described various communication protocols.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 23:
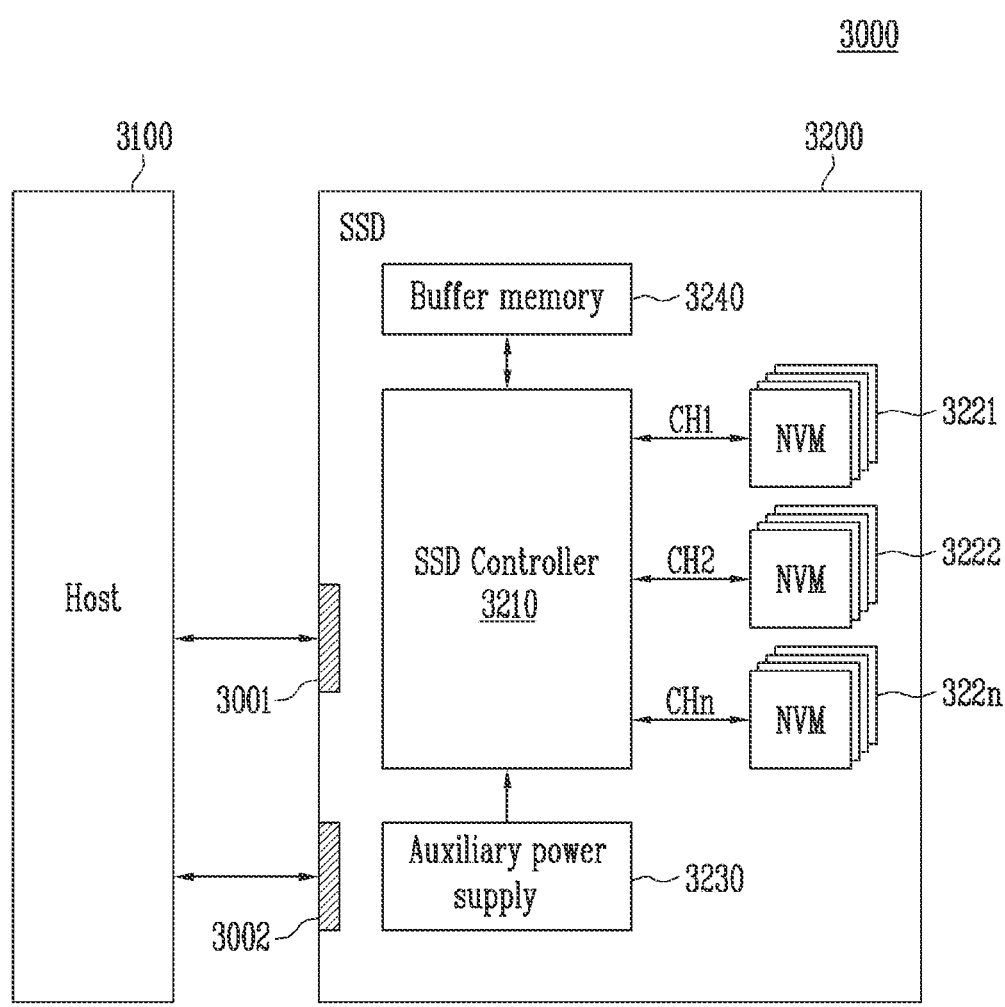
FIG. 23 is a diagram illustrating a Solid State Drive (SSD) system to which the memory device of the present disclosure is applied.

FIG. 23 is a diagram illustrating a Solid State Drive (SSD) system to which the memory device of the present disclosure is applied.

Referring to FIG. 23, the SSD system 3000 includes a host 3100 and an SSD 3200. The SSD 3200 exchanges a signal with the host 3100 through a signal connector 3001, and receives a power voltage through a power connector 3002. The SSD 3200 includes an SSD controller 3210, a plurality of flash memories 3221 to 322n, an auxiliary power supply 3230, and a buffer memory 3240.

In accordance with an embodiment of the present disclosure, the flash memories 3221 to 322n may be configured identically to the memory device 1100 described with reference to FIG. 1.

The SSD controller 3210 may control the plurality of flash memories 3221 to 322n in response to a signal received from the host 3100. Exemplarily, the signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power input from the host 3100, and charge the power. When the supply of power from the host 3100 is not smooth, the auxiliary power supply 3230 may provide power of the SSD 3200. Exemplarily, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, the material constituting the plug is changed, so that the erase operation of the memory device can be improved.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A memory device comprising:
a stack structure including word lines and a select line;
a vertical hole vertically penetrating the stack structure; and
a memory layer, a channel layer, and a plug, sequentially formed along an inner side surface of the vertical hole,
wherein the plug includes a material layer having a fixed negative charge, and
wherein a bottom surface of the material layer is located between a bottom surface and a top surface of the select line.

2. The memory device of claim 1, wherein the material layer includes an Al2O3 layer.

3. The memory device of claim 1, wherein the plug includes:
a first insulating layer;
the material layer formed on the first insulating layer; and
a capping pattern formed on the material layer.

4. The memory device of claim 3, wherein the first insulating layer includes an oxide layer, and
the capping pattern includes doped silicon.

5. The memory device of claim 3, wherein the material layer is formed at a position adjacent to the select line in the plug.

6. The memory device of claim 5, wherein a top surface of the material layer is located in a region higher than the top surface of the select line.

7. The memory device of claim 1, wherein the plug includes a first insulating layer, the material layer, and a second insulating layer, and wherein the material layer is disposed between the first and second insulating layers.

8. The memory device of claim 7, wherein a top surface of the material layer is located at a height greater than a height at which the top surface of the select line is located.

9. The memory device of claim 1, wherein the plug includes a first insulating layer and the material layer, and
wherein a position of a top surface of the material layer is equal to that of a top surface of the plug.

10. A memory device comprising:
a stack structure including first select lines adjacent to bit lines, second select lines adjacent to a source line, and word lines between the first and second select lines;
a vertical hole vertically penetrating the stack structure; and
a memory layer, a channel layer, and a plug, sequentially formed along an inner side surface of the vertical hole,
wherein the plug includes a material layer having a fixed negative charge, and
wherein a bottom surface of the material layer is located between a bottom surface of a first select line located at a lowermost end among the first select lines and a top surface of a first select line located at an uppermost end among the first select lines.

11. The memory device of claim 10, wherein the material layer includes an Al2O3 layer.

12. The memory device of claim 10, wherein the plug includes:
a first insulating layer;
the material layer formed on the first insulating layer; and
a capping pattern formed on the material layer.

13. The memory device of claim 12, wherein the capping pattern includes doped silicon.

14. The memory device of claim 10, wherein the plug includes a first insulating layer, the material layer, and a second insulating layer, and
wherein the material layer is disposed between the first and second insulating layers.

15. The memory device of claim 14, wherein a top surface of the material layer is located on the top of the top surface of the first select line located at the uppermost end among the first select lines.

16. The memory device of claim 10, wherein the plug includes a first insulating layer and the material layer, and
wherein a position of a top surface of the material layer is equal to that of a top surface of the plug.

* * * * *